(12) United States Patent  (10) Patent No.: US 12,170,243 B2
Pan  (45) Date of Patent: Dec. 17, 2024

(54) DIELECTRIC ANCHORS FOR ANCHORING A CONDUCTIVE PILLAR

(71) Applicant: Taiwan Semiconductor Manufacturing Company, Ltd., Hsinchu (TW)

(72) Inventor: Lung Yuan Pan, Hsinchu (TW)

(73) Assignee: Taiwan Semiconductor Manufacturing Company, Ltd., Hsinchu (TW)

(*) Notice: Subject to any disclaimer, the term of this patent is extended or adjusted under 35 U.S.C. 154(b) by 378 days.

(21) Appl. No.: 17/682,238

(22) Filed: Feb. 28, 2022

(65) Prior Publication Data

US 2023/0275012 A1 Aug. 31, 2023

(51) Int. Cl.
*H01L 23/498* (2006.01)
*H01L 21/768* (2006.01)
*H01L 23/00* (2006.01)

(52) U.S. Cl.
CPC .. *H01L 23/49827* (2013.01); *H01L 21/76898* (2013.01); *H01L 23/49838* (2013.01); *H01L 24/16* (2013.01); *H01L 2224/16146* (2013.01)

(58) Field of Classification Search
CPC ......... H01L 23/49827; H01L 23/49838; H01L 23/5384; H01L 23/481; H01L 23/4824; H01L 23/4825; H01L 21/76898
See application file for complete search history.

(56) References Cited

U.S. PATENT DOCUMENTS

| 8,202,801 | B1* | 6/2012 | Lin | H01L 23/481 |
| | | | | 257/E21.597 |
| 8,519,515 | B2* | 8/2013 | Kuo | H01L 23/481 |
| | | | | 257/E21.597 |
| 9,852,965 | B2* | 12/2017 | Lee | H01L 23/481 |
| 2007/0278529 | A1* | 12/2007 | Lai | H10N 70/041 |
| | | | | 257/209 |
| 2012/0049358 | A1* | 3/2012 | Cheng | H01L 21/76898 |
| | | | | 438/666 |
| 2012/0068327 | A1* | 3/2012 | Oganesian | H01L 23/49838 |
| | | | | 257/E21.597 |
| 2013/0020698 | A1* | 1/2013 | Hsieh | H01L 24/81 |
| | | | | 257/737 |
| 2020/0027893 | A1* | 1/2020 | Yang | H10B 41/50 |
| 2021/0391237 | A1* | 12/2021 | Kao | H01L 25/0657 |

* cited by examiner

*Primary Examiner* — Victor A Mandala
*Assistant Examiner* — Lawrence C Tynes, Jr.
(74) *Attorney, Agent, or Firm* — Eschweiler & Potashnik, LLC

(57) ABSTRACT

Various embodiments of the present disclosure are directed towards an apparatus comprising a semiconductor substrate. A conductive pillar is disposed in the semiconductor substrate. An isolation region is disposed in the semiconductor substrate and extends laterally around the conductive pillar. The isolation region is configured to electrically isolate the conductive pillar from a surrounding portion of the semiconductor substrate. An opening is disposed in the isolation region. A dielectric anchor is disposed in the isolation region. The dielectric anchor extends vertically through the semiconductor substrate along a side of the opening. The dielectric anchor anchors the conductive pillar to the semiconductor substrate.

20 Claims, 15 Drawing Sheets

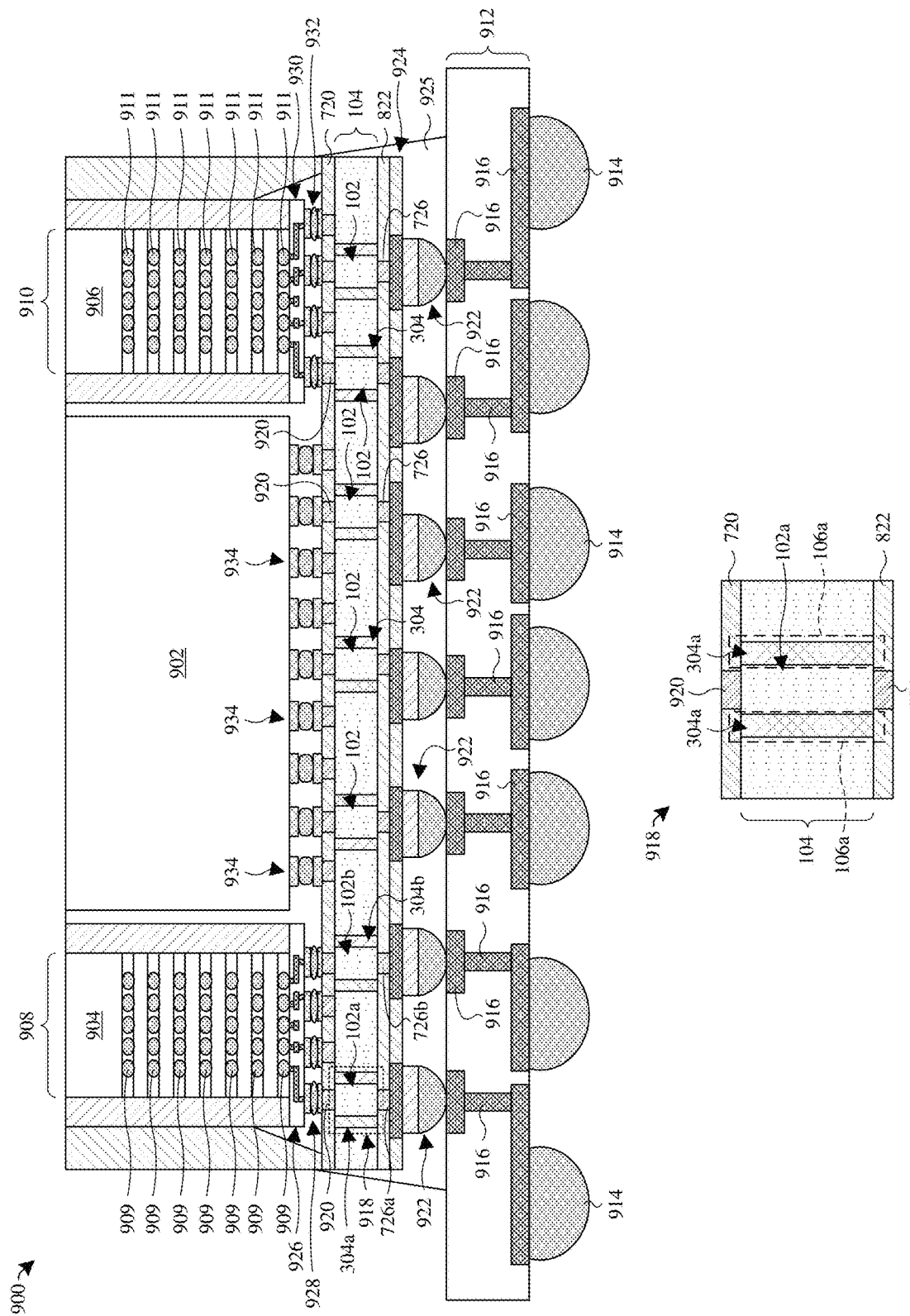

DIELECTRIC ANCHORS FOR ANCHORING A CONDUCTIVE PILLAR

BACKGROUND

The semiconductor industry has continually improved the processing capabilities and power consumption of integrated chips (ICs) by shrinking the minimum feature size. However, in recent years, process limitations have made it difficult to continue shrinking the minimum feature size. The stacking of two-dimensional (2D) ICs via various three-dimensional (3D) integration technologies has emerged as a potential approach to continue improving processing capabilities and power consumption of ICs.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 9 illustrates a cross-sectional view of some other embodiments of the IC of FIG. 7.

DETAILED DESCRIPTION

Figure 1A:
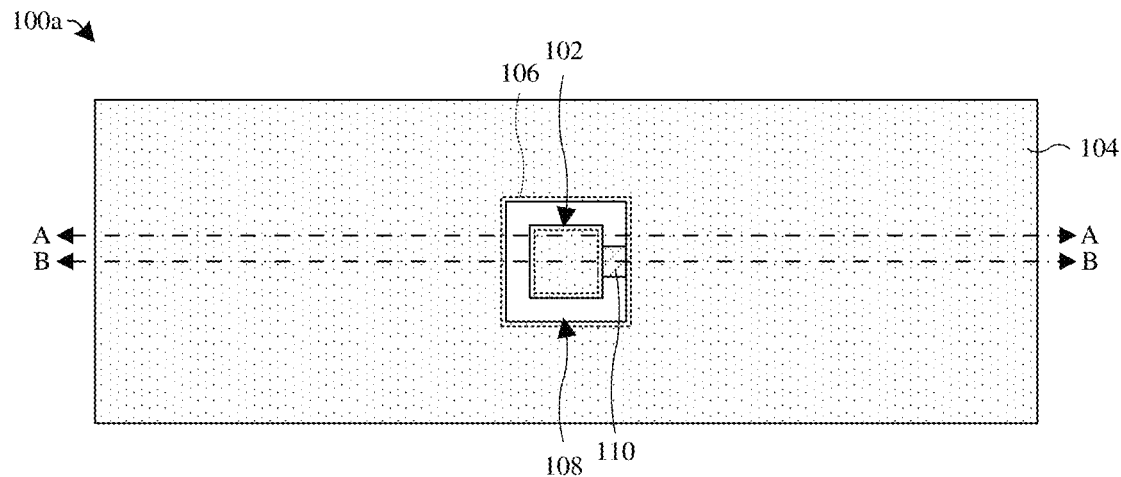
FIGS. 1A-1C illustrates various views of some embodiments of a conductive pillar disposed in a first semiconductor substrate and anchored to the first semiconductor substrate by a dielectric anchor.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Three-dimensional (3D) integration techniques (e.g., 3D wafer-level packaging, 2.5D and 3D interposer-based integration, 3D stacked ICs, monolithic 3D ICs, 3D heterogeneous integration, 3D systems integration, etc.) are often utilized to stack two-dimensional (2D) integrated chips (ICs) into a 3D IC. For example, a 3D IC may comprise a first IC die (e.g., a first 2D IC) and a second IC die (e.g., a second 2D IC). The first IC die and the second IC die are coupled to a semiconductor substrate. A conductive pillar (e.g., a through-substrate conductive silicon pillar) is disposed in the semiconductor substrate and is electrically coupled to a conductive feature of the first IC die (e.g., copper interconnect of the first IC die). The conductive pillar extends vertically through the semiconductor substrate and provides an electrical connection to the first IC die.

The conductive pillar is electrically isolated from surrounding portions of the semiconductor substrate. The conductive pillar may be electrically isolated from the surrounding portions of the semiconductor substrate via an air trench. The air trench is an opening that extends laterally around the conductive pillar in a closed loop path (e.g., a trench filled with air (or some other gas) that laterally surrounds the conductive pillar). While the air trench provides good electrical isolation between the conductive pillar and the surrounding portions of the semiconductor substrate, the air trench may negatively affect the structural strength of the conductive pillar and/or semiconductor substrate. As such, a relatively small mechanical force may cause the conductive pillar to fail (e.g., crack, dislodge, etc.) during fabrication and/or consumer use of the 3D IC (e.g., accidental drop of a device comprising the 3D IC), thereby resulting in reduced yield and/or reduced device performance.

Various embodiments of the present application are directed toward an integrated chip (IC) having a conductive pillar that is anchored to a semiconductor substrate via a dielectric anchor. The IC comprises a semiconductor substrate (e.g., silicon substrate). A conductive pillar (e.g., through-substrate conductive silicon pillar) is disposed in the semiconductor substrate. An isolation region is disposed in the semiconductor substrate and extends laterally around the conductive pillar in a closed loop path. The isolation region is configured to electrically isolate the conductive pillar from a surrounding portion of the semiconductor substrate. An opening is disposed in the semiconductor substrate and in the isolation region. A dielectric anchor is disposed in the semiconductor substrate and in the isolation region. The dielectric anchor is disposed along a side of the opening. The dielectric anchor anchors the conductive pillar to the semiconductor substrate.

Because the opening is disposed in the isolation region, the isolation region provides good electrical isolation between the conductive pillar and the surrounding portions of the semiconductor substrate. Further, because the dielectric anchor anchors the conductive pillar to the semiconductor substrate, the dielectric anchor provides structural support to the conductive pillar. As such, the conductive pillar may be less prone to failure (e.g., due to the increased structural support preventing cracking/dislodging of the conductive pillar) during fabrication and/or consumer use of the IC, thereby resulting in increased yield and/or improved device performance.

Figure 1B:
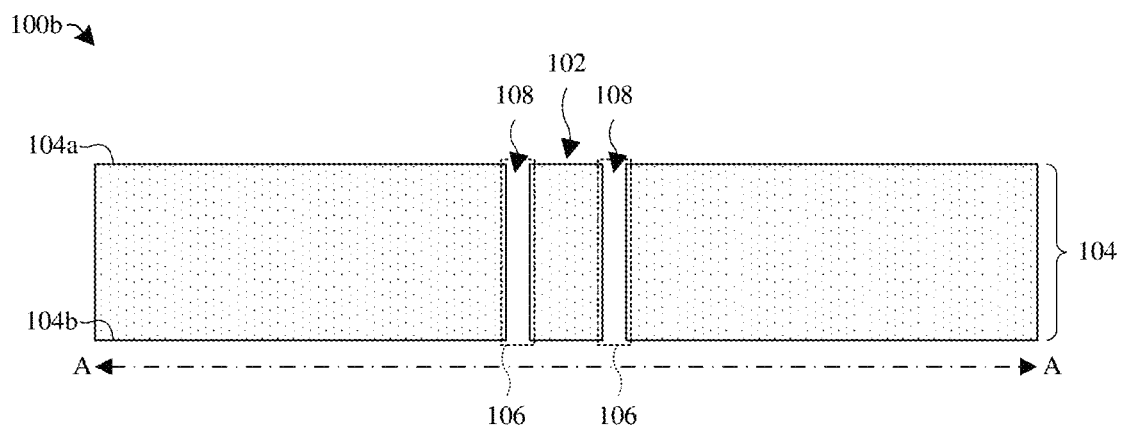
Figure 1C:
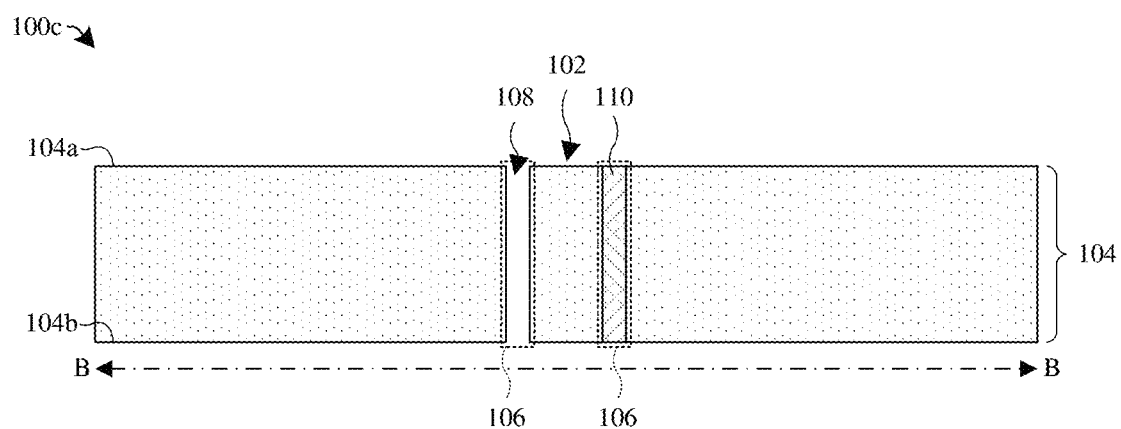

FIGS. 1A-1C illustrates various views 100a-100c of some embodiments of a conductive pillar disposed in a first semiconductor substrate and anchored to the first semiconductor substrate by a dielectric anchor. FIG. 1A illustrates a top view 100a of some embodiments of the first semiconductor substrate, the dielectric anchor, and the conductive pillar. FIG. 1B illustrates a cross-sectional view 100b of the structure illustrated in FIG. 1A taken along line A-A of FIG. 1A. FIG. 1C illustrates a cross-sectional view 100c of the structure illustrated in FIG. 1A taken along line B-B of FIG. 1A.

As shown in the various views 100a-100c of FIGS. 1A-1C, a conductive pillar 102 is disposed in a first semiconductor substrate 104. The first semiconductor substrate 104 comprises any type of semiconductor body (e.g., silicon (Si), germanium (Ge), silicon-germanium (SiGe), monocrystalline silicon/CMOS bulk, a III-V semiconductor, etc.). In some embodiments, the first semiconductor substrate 104 is silicon (Si). In further embodiments, the first semiconductor substrate 104 is monocrystalline silicon (Si). The first semiconductor substrate 104 has a first side 104a (e.g., front-side) and a second side 104b (e.g., back-side) opposite the first side 104a.

The conductive pillar 102 extends vertically through the first semiconductor substrate 104. In some embodiments, the conductive pillar 102 extends vertically through the first semiconductor substrate 104 from the first side 104a to the second side 104b. In some embodiments, the conductive pillar 102 has a square-like layout, as illustrated in the top view 100a of FIG. 1A. In other embodiments, the conductive pillar 102 may have a different layout, such as, a rectangular-like layout, a circular-like layout, or some other geometrical-shape layout.

Further, the conductive pillar 102 is or comprises a conductive material (e.g., the conductive pillar 102 is a silicon through-substrate via (TSV)). In some embodiments, the conductive material comprises a semiconductor material (e.g., silicon (Si), germanium (Ge), silicon-germanium (SiGe), a III-V semiconductor, etc.). In further embodiments, the conductive material is a low resistivity semiconductor material. The low resistivity semiconductor material has a sheet resistance less than 0.01 ohm-cm. In some embodiments, the first semiconductor substrate 104 and the conductive pillar 102 are the same semiconductor material (e.g., low-resistivity Si). In other embodiments, the conductive pillar 102 is a different semiconductor material than the first semiconductor substrate 104. It will be appreciated that, in other embodiments, the conductive pillar 102 may be or comprise other types of conductive materials (e.g., a metal).

The conductive pillar 102 is configured to provide an electrical connection (e.g., electrical path) through the first semiconductor substrate 104 and between two conductive features. For example, the conductive pillar 102 may provide an electrical connection between a conductive feature of a first integrated chip (IC) (not shown) and a conductive feature of a second IC (not shown). In other embodiments, the conductive pillar 102 may provide an electrical connection between the first IC (and/or the second IC) and an input/output (I/O) structure (e.g., solder bumps, bond pads, etc.).

An isolation region 106 is disposed in the first semiconductor substrate 104. The isolation region 106 extends laterally around the conductive pillar 102 in a closed loop path. The isolation region 106 is configured to electrically isolate the conductive pillar 102 from surrounding portions of the first semiconductor substrate 104. In other words, the isolation region 106 comprises features (e.g., features are disposed in the isolation region 106) that electrically isolate the conductive pillar 102 from the first semiconductor substrate 104.

An opening 108 is disposed in the isolation region 106. The opening 108 extends vertically through the first semiconductor substrate 104. In some embodiments, the opening 108 extends vertically through the first semiconductor substrate 104 from the first side 104a to the second side 104b. The opening 108 extends vertically through the first semiconductor substrate 104 along a side(s) of the conductive pillar 102. In some embodiments, the opening is referred to as a trench.

A dielectric anchor 110 is disposed in the isolation region 106. The dielectric anchor 110 is disposed along a side of the opening 108 and a side of the conductive pillar 102. The dielectric anchor 110 extends vertically through the first semiconductor substrate 104. In some embodiments, the dielectric anchor 110 extends vertically through the first semiconductor substrate 104 from the first side 104a to the second side 104b.

The opening 108 is at least partially defined by the dielectric anchor 110. For example, in some embodiments, a sidewall of the opening 108 is defined by a sidewall of the dielectric anchor 110. In further embodiments, as shown in the various views 100a-100c of FIGS. 1A-1C, a first sidewall of the dielectric anchor 110 may define a first sidewall of the opening 108 and a second sidewall of the dielectric anchor 110 (opposite the first sidewall of the dielectric anchor 110) may define a second sidewall of the opening 108 (opposite the first sidewall of the opening 108).

The dielectric anchor 110 anchors the conductive pillar 102 to the first semiconductor substrate 104. The dielectric anchor 110 anchors the conductive pillar 102 to the first semiconductor substrate 104 by being attached to (e.g., directly attached/contacting) the conductive pillar 102 and the first semiconductor substrate 104. In some embodiments, the dielectric anchor 110 is attached to an outer sidewall of the conductive pillar 102 and attached to an inner sidewall of the first semiconductor substrate 104, and the dielectric anchor 110 extends laterally between the outer sidewall of the conductive pillar 102 and the inner sidewall of the first semiconductor substrate 104, such that the dielectric anchor 110 anchors the conductive pillar 102 to the first semiconductor substrate 104.

The dielectric anchor 110 is or comprises a dielectric material. In some embodiments, the dielectric material is an oxide. In further embodiments, the dielectric material is an oxide of the conductive material of the conductive pillar 102. For example, the conductive pillar 102 is silicon (Si) and the dielectric anchor 110 is silicon oxide ($SiO_2$). In yet further embodiments, the dielectric material is an oxide of the conductive material of the conductive pillar 102 and an oxide of the first semiconductor substrate 104. For example, both the conductive pillar 102 and the first semiconductor substrate 104 are silicon (Si) and the dielectric anchor 110 is silicon oxide (SiO$_2$). It will be appreciated that the dielectric anchor 110 may be or comprise some other dielectric material, such as, a nitride (e.g., silicon nitride (SiN)), an oxy-nitride (e.g., silicon oxy-nitride (SiON)), a low-k dielectric (e.g., a dielectric material with a dielectric constant less than about 3.9), a high-k dielectric material (e.g., a dielectric material with a dielectric constant greater than about 3.9), or the like.

Because the opening 108 and the dielectric anchor 110 are disposed in the isolation region 106 (e.g., the opening 108 and the dielectric anchor 110 laterally separate the conductive pillar 102 from the first semiconductor substrate 104), the conductive pillar 102 is electrically isolated from the surrounding portions of the first semiconductor substrate 104. Further, because the opening 108 is disposed in the isolation region 106, the isolation region 106 provides good electrical isolation between the conductive pillar 102 and the surrounding portions of the first semiconductor substrate 104 (e.g., due to the opening 108 being a void filled with air). Moreover, because the dielectric anchor 110 anchors the conductive pillar 102 to the first semiconductor substrate 104, the dielectric anchor 110 provides structural support to the conductive pillar 102 (e.g., increases the rigidity of the conductive pillar 102). Therefore, the conductive pillar 102 may be less prone to failure (e.g., due to the increased structural support preventing cracking/dislodging of the conductive pillar 102) during fabrication and/or consumer use, thereby resulting in increased yield and/or improved device performance.

For example, a three-dimensional (3D) IC may comprise a first IC that is bonded to the first semiconductor substrate 104, where the conductive pillar 102 provides an electrical connection between the first IC and an I/O structure (or a second IC). During fabrication of the 3D IC (e.g., bonding of the first IC to the first semiconductor substrate 104), the increased structural support provided by the dielectric anchor 110 may prevent the conductive pillar 102 from cracking/dislodging (e.g., due to mechanical forces during the bonding process), thereby increasing yield. Further, during consumer use of the 3D IC, the increased structural support provided by the dielectric anchor 110 may also improve device performance of the 3D IC (e.g., preventing cracking/dislodging of the conductive pillar 102 may increase the mechanical robustness of the 3D IC during consumer use).

Figure 2A:
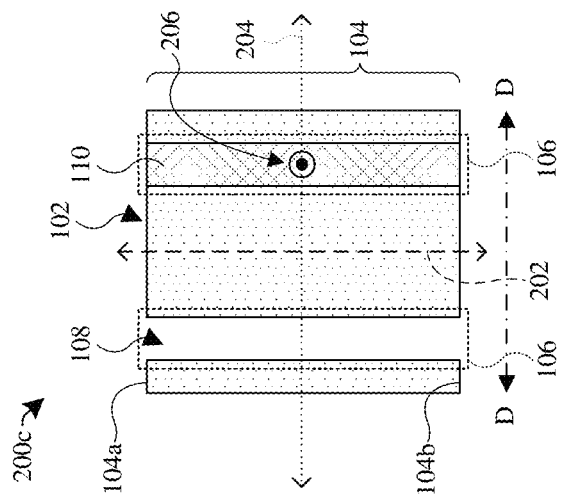
FIGS. 2A-2C illustrate other various views of the structure illustrated in FIGS. 1A-1C.
Figure 2B:
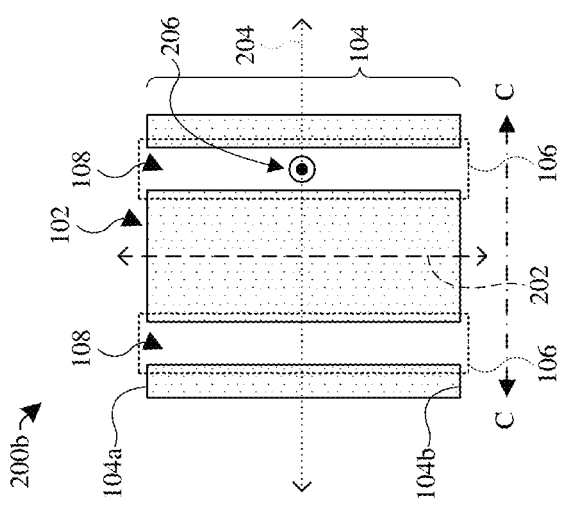
Figure 2C:
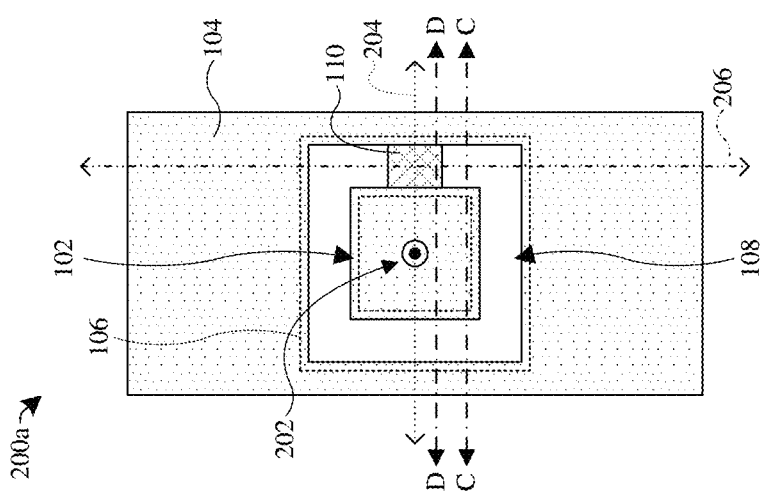

FIGS. 2A-2C illustrate other various views 200a-200c of the structure illustrated in FIGS. 1A-1C. FIG. 2A illustrates a top view 200a of the structure illustrated in FIGS. 1A-1C. FIG. 2B illustrates a cross-sectional view 200b of the structure illustrated in FIG. 2A taken along line C-C of FIG. 2A. FIG. 2C illustrates a cross-sectional view 200c of the structure illustrated in FIG. 2A taken along line D-D of FIG. 2A.

As shown in the various views 200a-200c of FIGS. 2A-2C, the isolation region 106 extends laterally around the conductive pillar 102 and a first axis 202 in the closed loop path. The first axis 202 extends vertically through a center (e.g., centroid) of the conductive pillar 102. The dielectric anchor 110 extends radially from the first axis 202 to anchor the conductive pillar 102 to the first semiconductor substrate 104. In some embodiments, the dielectric anchor 110 extends radially from the first axis 202 along a second axis 204 that is perpendicular to the first axis 202. In further embodiments, the dielectric anchor 110 extends laterally (e.g., from the first sidewall of the dielectric anchor 110 to the second sidewall of the dielectric anchor 110) in a third axis 206 that is perpendicular to the second axis. A plane, which the second axis 204 and the third axis 206 are disposed on, intersects the conductive pillar 102, the first axis 202, the opening 108, and the first semiconductor substrate 104. The plane is disposed vertically between an upper surface (e.g., the first side 104a) of the first semiconductor substrate 104 and a lower surface (e.g., the second side 104b) of the first semiconductor substrate 104.

In some embodiments, an upper surface of the dielectric anchor 110 is substantially coplanar with the upper surface of the first semiconductor substrate 104. In other embodiments, the upper surface of the dielectric anchor 110 is disposed over or below the upper surface of the first semiconductor substrate 104. In some embodiments, a lower surface of the dielectric anchor 110 is substantially coplanar with the lower surface of the first semiconductor substrate 104. In other embodiments, the lower surface of the dielectric anchor 110 is disposed over or below the lower surface of the first semiconductor substrate 104.

Figure 3A:
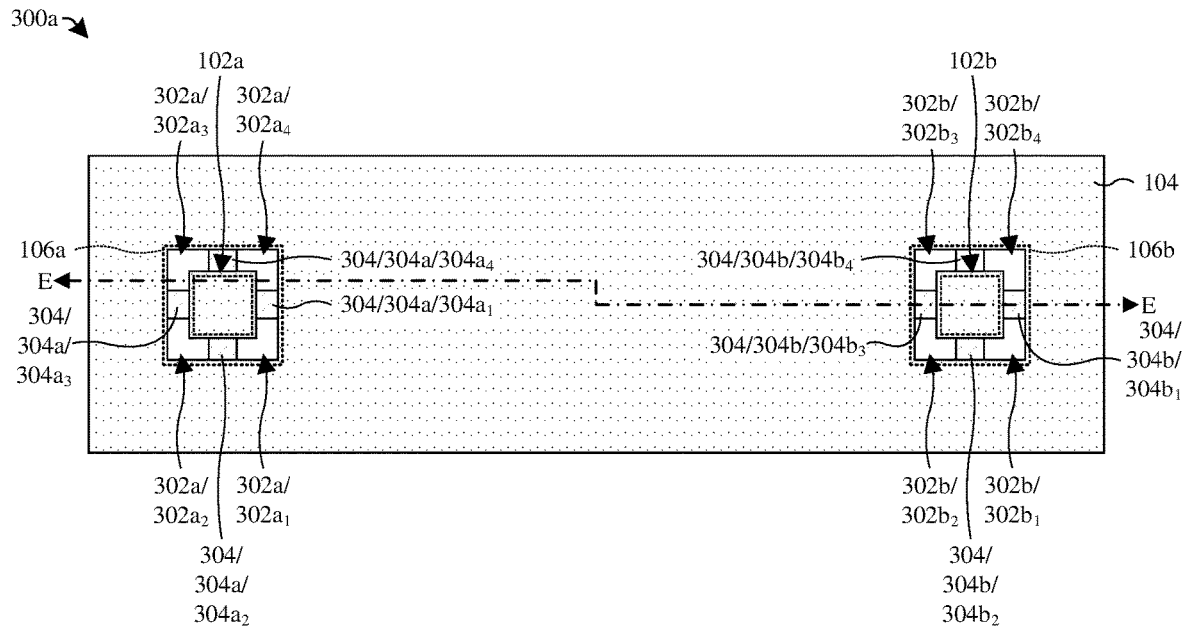
FIGS. 3A-3B illustrate various views of some other embodiments of the structure illustrated in FIGS. 1A-1C.
Figure 3B:
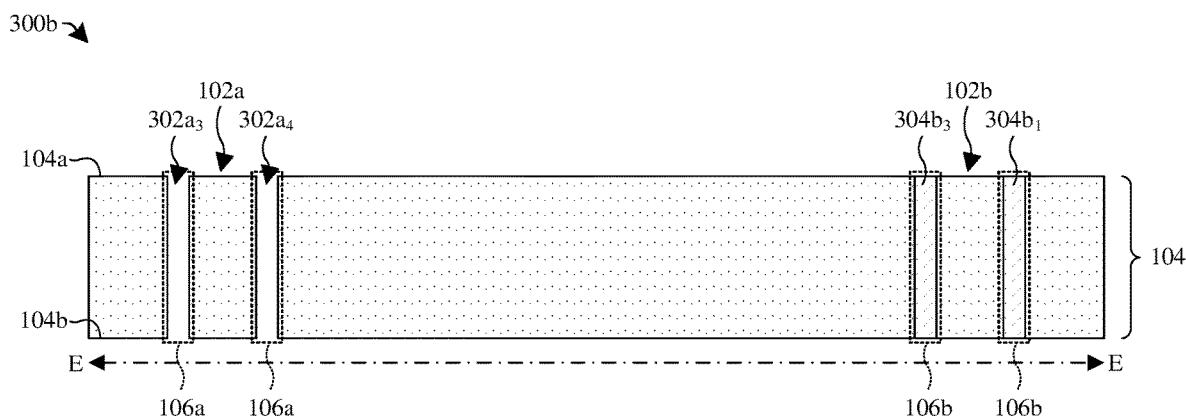

FIGS. 3A-3B illustrate various views 300a-300b of some other embodiments of the structure illustrated in FIGS. 1A-1C. FIG. 3A illustrates a top view 300a of some other embodiments of the structure illustrated in FIGS. 1A-1C. FIG. 3B illustrates a cross-sectional view 300b of the structure illustrated in FIG. 3A taken along line E-E of FIG. 3A.

As shown in the various views 300a-300b of FIGS. 3A-3B, a plurality of conductive pillars 102a-b are disposed in the first semiconductor substrate 104. For example, the plurality of conductive pillars 102a-b comprises a first conductive pillar 102a and a second conductive pillar 102b. The plurality of conductive pillars 102a-b are laterally spaced from one another. Each of the conductive pillars of the plurality of conductive pillars 102a-b may have substantially similar features (e.g., structural features, functional features, etc.) as the conductive pillar 102 described herein. While the various views 300a-300b of FIGS. 3A-3B illustrate the plurality of conductive pillars 102a-b comprising two conductive pillars, it will be appreciated that the plurality of conductive pillars 102a-b may comprise any number of conductive pillars (e.g., 3, 4, 5, 10, 20, etc.).

A plurality of isolation regions 106a-b are disposed in the first semiconductor substrate 104. For example, a first isolation region 106a and a second isolation region 106b are disposed in the first semiconductor substrate 104. In some embodiments, the plurality of isolation regions 106a-b are laterally spaced from one another. The plurality of isolation regions 106a-b extend laterally around the plurality of conductive pillars 102a-b in closed loop paths. For example, the first isolation region 106a extends laterally around the first conductive pillar 102a in a first closed loop path, and the second isolation region 106b extends laterally around the second conductive pillar 102b in a second closed loop path. Each of the isolation regions of the plurality of isolation regions 106a-b may have substantially similar features (e.g., structural features, functional features, etc.) as the isolation region 106 described herein.

A plurality of openings may be disposed in each of the plurality of isolation regions 106a-b. For example, a first plurality of openings 302a are disposed in the first isolation region 106a and a second plurality of openings 302b are disposed in the second isolation region 106b. The first plurality of openings 302a may comprise a first opening 302a$_1$, a second opening 302a$_2$, a third opening 302a$_3$, and a fourth opening 302a$_4$. The second plurality of openings 302b may comprise a first opening 302b$_1$, a second opening $302b_2$, a third opening $302b_3$, and a fourth opening $302b_4$. Each of the openings of the plurality of openings (e.g., the first plurality of openings 302a and the second plurality of openings 302b) may have substantially similar features (e.g., structural features, functional features, etc.) as the opening 108 described herein. While the various views 300a-300b of FIGS. 3A-3B illustrate the plurality of openings each comprising four openings, it will be appreciated that the plurality of openings may comprise any number of openings. It will also be appreciated that a single opening (see, e.g., FIGS. 1A-1C) may be disposed in each of the plurality of isolation regions 106a-b. In some embodiments, the plurality of openings are referred to as the plurality of trenches.

A plurality of dielectric anchors 304 are disposed in each of the plurality of isolation regions 106a-b. For example, a first plurality of dielectric anchors 304a are disposed in the first isolation region 106a and a second plurality of dielectric anchors 304b are disposed in the second isolation region 106b. The first plurality of dielectric anchors 304a may comprise a first dielectric anchor $304a_1$, a second dielectric anchor $304a_2$, a third dielectric anchor $304a_3$, and a fourth dielectric anchor $304a_4$. The second plurality of dielectric anchors 304b may comprise a first dielectric anchor $304b_1$, a second dielectric anchor $304b_2$, a third dielectric anchor $304b_3$, and a fourth dielectric anchor $304b_4$. Each of the dielectric anchors of the plurality of dielectric anchors (e.g., the first plurality of dielectric anchors 304a and the second plurality of dielectric anchors 304b) may have substantially similar features (e.g., structural features, functional features, etc.) as the dielectric anchor 110 described herein. While the various views 300a-300b of FIGS. 3A-3B illustrate the plurality of dielectric anchors each comprising four dielectric anchors, it will be appreciated that the plurality of dielectric anchors may comprise any number of dielectric anchors. It will also be appreciated that a single dielectric anchor (see, e.g., FIGS. 1A-1C) may be disposed in each of the plurality of isolation regions 106a-b.

Each of the dielectric anchors of the plurality of dielectric anchors are disposed laterally between two neighboring openings of the plurality of openings. For example, the first opening $302a_1$ and the fourth opening $302a_4$ of the first plurality of openings 302a neighbor one another, and the first dielectric anchor $304a_1$ of the first plurality of dielectric anchors 304a is disposed laterally between the first opening $302a_1$ and the fourth opening $302a_4$. Each of the dielectric anchors of the plurality of dielectric anchors anchor a corresponding conductive pillar to the first semiconductor substrate 104. For example, each of the dielectric anchors of the first plurality of dielectric anchors 304a anchor the first conductive pillar 102a to the first semiconductor substrate 104 by each of the dielectric anchors of the first plurality of dielectric anchors 304a being attached to (e.g., directly attached/contacting) the first conductive pillar 102a and the first semiconductor substrate 104. In some embodiments, each of the openings of the plurality of openings are at least partially defined by sidewalls of the dielectric anchors. For example, the first opening $302a_1$ is at least partially defined by a first sidewall of the first dielectric anchor $304a_1$ and a first sidewall of the second dielectric anchor $304a_2$, the second opening $302a_2$ is at least partially defined by a second sidewall of the second dielectric anchor $304a_2$ (opposite the first sidewall of the second dielectric anchor $304a_2$) and a sidewall of the third dielectric anchor $304a_3$, and so forth.

Figure 4A:
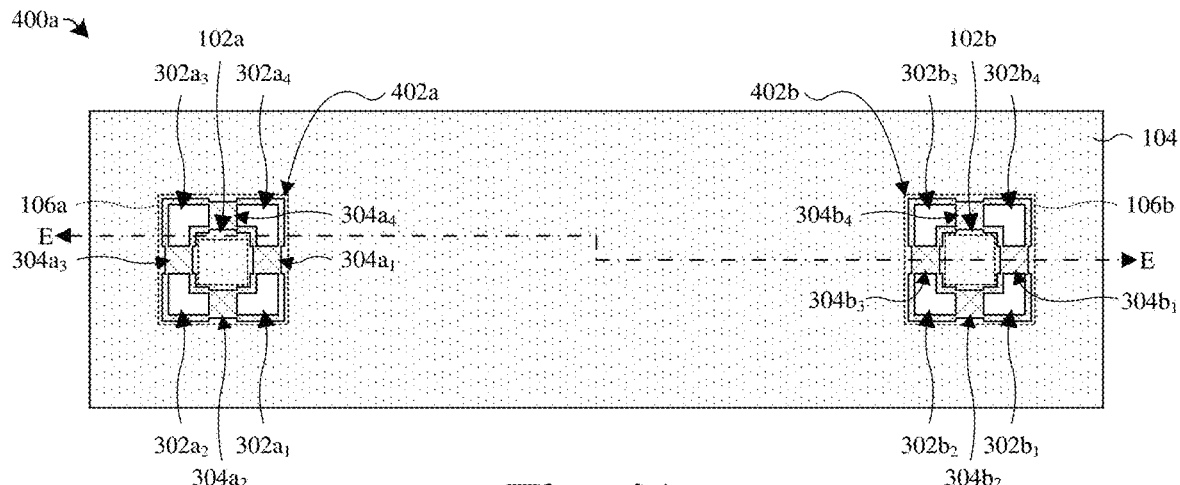
FIGS. 4A-4B illustrate various views of some other embodiments of the structure illustrated in FIGS. 3A-3B.
Figure 4B:
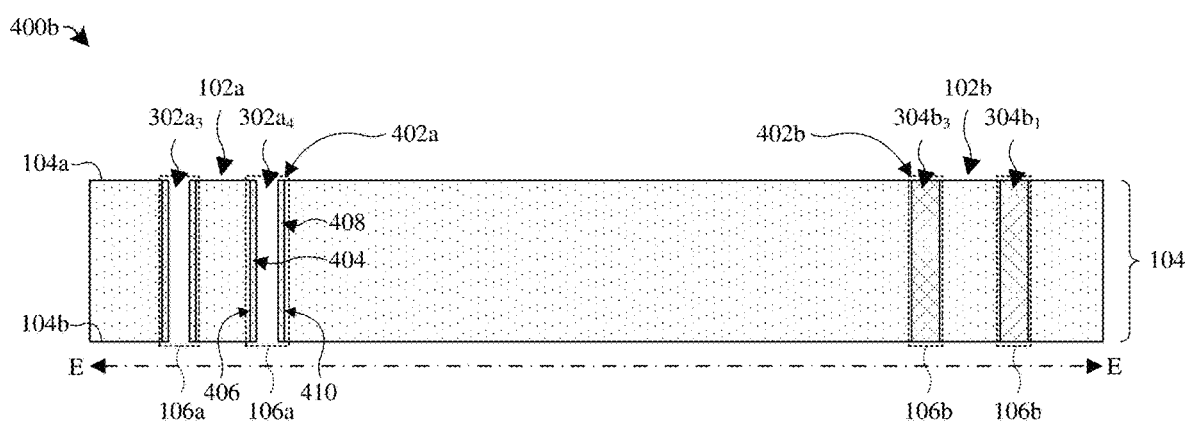

FIGS. 4A-4B illustrate various views 400a-400b of some other embodiments of the structure illustrated in FIGS. 3A-3B. FIG. 4A illustrates a top view 400a of some other embodiments of the structure illustrated in FIGS. 3A-3B. FIG. 4B illustrates a cross-sectional view 400b of the structure illustrated in FIG. 4A taken along line E-E of FIG. 4A.

As shown in the various views 400a-400b of FIGS. 4A-4B, a plurality of dielectric structures 402a-b are disposed in the plurality of isolation regions 106a-b. For example, a first dielectric structure 402a is disposed in the first isolation region 106a and a second dielectric structure 402b is disposed in the second isolation region 106b. The plurality of dielectric anchors are portions of a corresponding dielectric structure of the plurality of dielectric structures 402a-b. For example, the first dielectric anchor $304a_1$ is a first portion of the first dielectric structure 402a, the second dielectric anchor $304a_2$ is a second portion of the first dielectric structure 402a, the third dielectric anchor $304a_3$ is a third portion of the first dielectric structure 402a, and the fourth dielectric anchor $304a_4$ is a fourth portion of the first dielectric structure 402a. The plurality of dielectric structures are the same dielectric material as their corresponding dielectric anchors. For example, the first plurality of dielectric anchors 304a are silicon oxide ($SiO_2$) and the other portions of the first dielectric structure 402a are also silicon oxide ($SiO_2$).

Other portions of the plurality of dielectric structures at least partially line outer sidewalls of a corresponding conductive pillar of the plurality of conductive pillars 102a-b and inner sidewalls of the first semiconductor substrate 104. For example, a sixth portion 404 of the first dielectric structure 402a lines, at least partially, an outer sidewall 406 of the first conductive pillar 102a and a seventh portion 408 of the first dielectric structure 402a lines, at least partially, an inner sidewall 410 of the first semiconductor substrate 104. In some embodiments, the fourth opening $302a_4$ is at least partially defined by a second sidewall of the first dielectric anchor $304a_1$ (opposite the first sidewall of the first dielectric anchor $304a_1$), a sidewall of the fourth dielectric anchor $304a_4$, a sidewall of the sixth portion 404, and a sidewall of the seventh portion 408. In further embodiments, the sidewall of the sixth portion 404 of the first dielectric structure 402a faces the sidewall of the seventh portion 408 of the first dielectric structure 402a, as shown in the various views 400a-b of FIGS. 4A-4B.

Figure 5A:
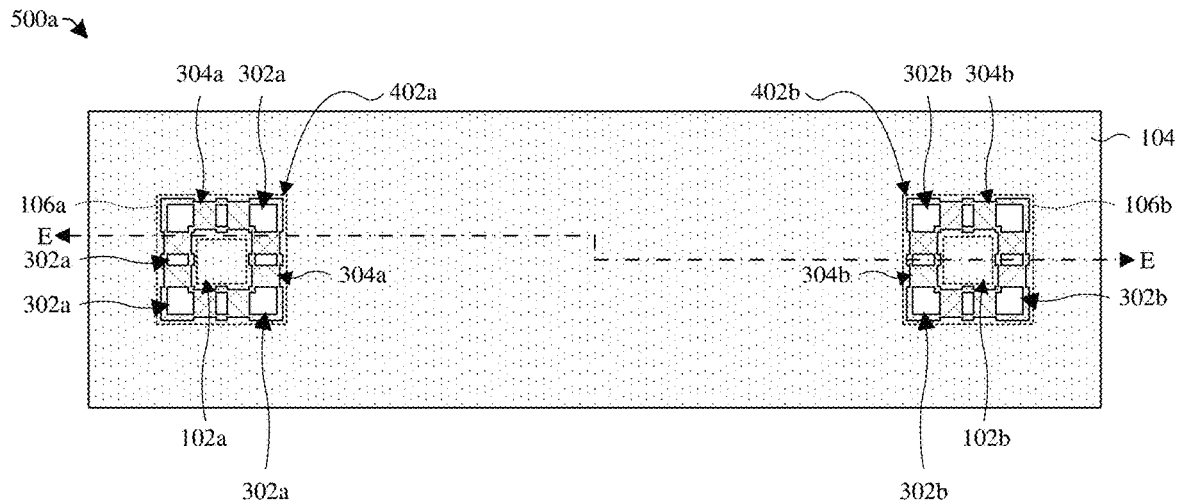
FIGS. 5A-5C illustrate various views of some other embodiments of the structure illustrated in FIGS. 4A-4B.
Figure 5B:
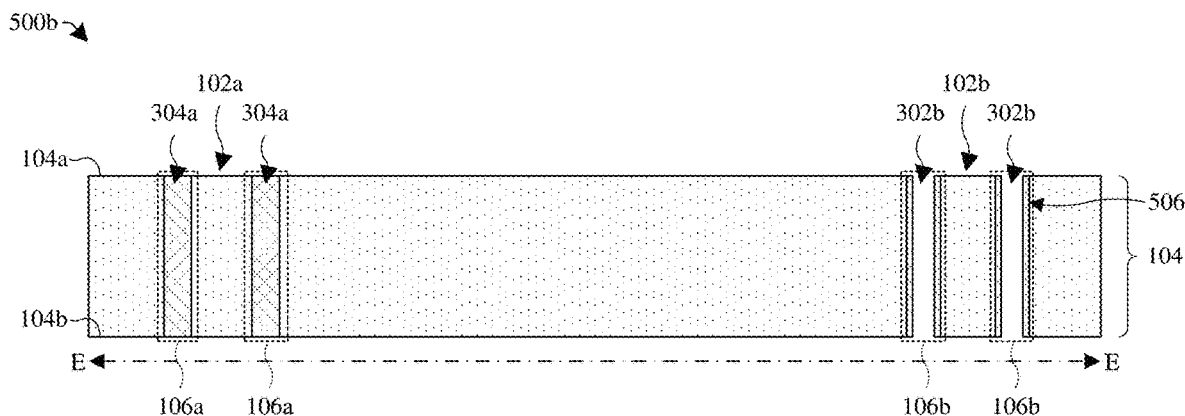
Figure 5C:
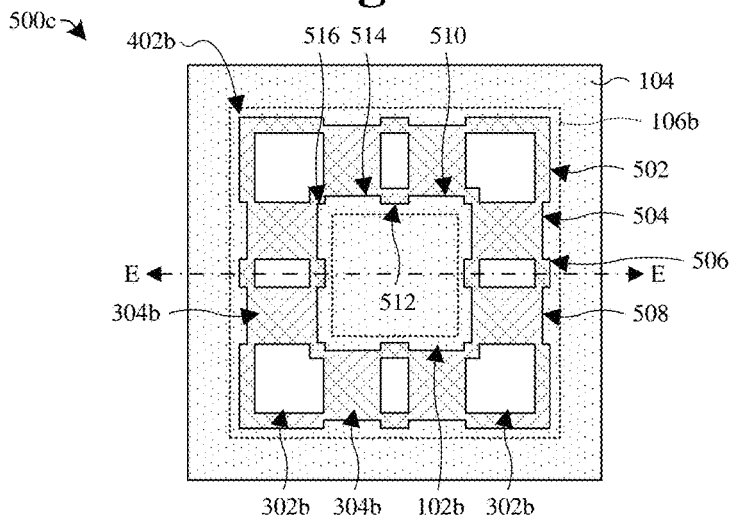

FIGS. 5A-5C illustrate various views 500a-500c of some other embodiments of the structure illustrated in FIGS. 4A-4B. FIG. 5A illustrates a top view 500a of some other embodiments of the structure illustrated in FIGS. 4A-4B. FIG. 5B illustrates a cross-sectional view 500b of the structure illustrated in FIG. 5A taken along line E-E of FIG. 5A. FIG. 5C illustrates an enlarged view 500c of an area of the top view 500a of FIG. 5A.

As shown in the various views 500a-500c of FIGS. 5A-5C, in some embodiments, the plurality of openings comprises eight openings. For example, the first plurality of openings 302a comprises eight openings and the second plurality of openings 302b comprises eight other openings. In further embodiments, the plurality of dielectric anchors comprises eight dielectric anchors. For example, the first plurality of dielectric anchors 304a comprises eight dielectric anchors, and the second plurality of dielectric anchors 304b comprises eight other dielectric anchors. For clarity in FIGS. 5A-5C, only some of the openings of the plurality of openings and only some of the dielectric anchors of the plurality of dielectric anchors are labeled in FIGS. 5A-5C.

Also shown in the various views 500a-500c of FIGS. 5A-5C, in some embodiments, some outer sidewalls of the plurality of dielectric structures 402a-b are laterally spaced from some other outer sidewalls of the plurality of dielectric structures 402a-b. For example, a first outer sidewall 502 of the second dielectric structure 402b is laterally spaced from a second outer sidewall 504 of the second dielectric structure 402b in a first lateral direction. A third outer sidewall 506 of the second dielectric structure 402b may also be laterally spaced from the second outer sidewall 504 of the second dielectric structure 402b in the first lateral direction. In some embodiments, the first outer sidewall 502 of the second dielectric structure 402b and the third outer sidewall 506 of the second dielectric structure 402b are aligned along a first lateral plane. In some embodiments, the second outer sidewall 504 of the second dielectric structure 402b and a fourth outer sidewall 508 of the second dielectric structure 402b are aligned along a second lateral plane. The first lateral plane and the second lateral plane may be parallel to one another. The first lateral plane may be laterally spaced from the second lateral plane in the first direction.

In some embodiments, some inner sidewalls of the plurality of dielectric structures 402a-b are laterally spaced from some other inner sidewalls of the plurality of dielectric structures 402a-b. For example, a first inner sidewall 510 of the second dielectric structure 402b is laterally spaced from a second inner sidewall 512 of the second dielectric structure 402b in a second lateral direction. In some embodiments, the second lateral direction is transverse the first lateral direction. A third inner sidewall 514 of the second dielectric structure 402b may also be laterally spaced from the second inner sidewall 512 of the second dielectric structure 402b in the second lateral direction. In some embodiments, the first inner sidewall 510 of the second dielectric structure 402b and the third inner sidewall 514 of the second dielectric structure 402b are aligned along a third lateral plane. In some embodiments, the second inner sidewall 512 of the second dielectric structure 402b and a fourth inner sidewall 516 of the second dielectric structure 402b are aligned along a fourth lateral plane. The third lateral plane and the fourth lateral plane may be parallel to one another. The third lateral plane may be laterally spaced from the fourth lateral plane in the second direction.

Figure 6A:
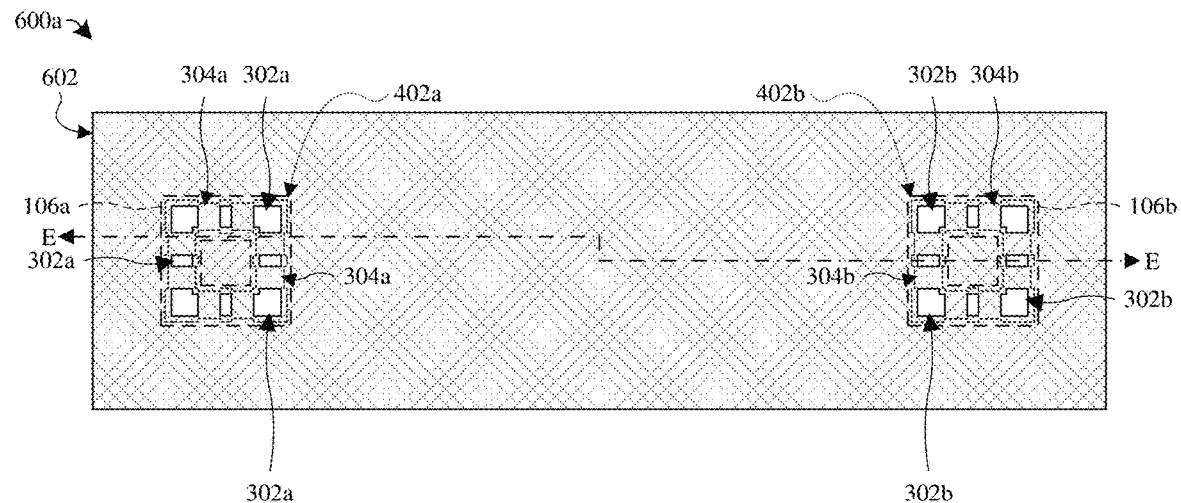
FIGS. 6A-6B illustrate various views of some other embodiments of the structure illustrated in FIGS. 5A-5C.
Figure 6B:
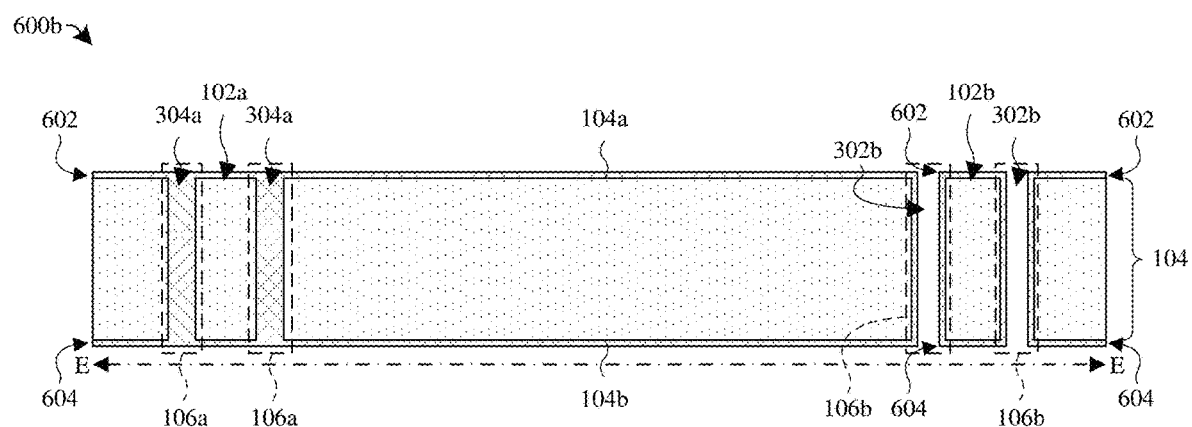

FIGS. 6A-6B illustrate various views 600a-600b of some other embodiments of the structure illustrated in FIGS. 5A-5C. FIG. 6A illustrates a top view 600a of some other embodiments of the structure illustrated in FIGS. 5A-5C. FIG. 6B illustrates a cross-sectional view 600b of the structure illustrated in FIG. 6A taken along line E-E of FIG. 6A.

As shown in the various views 600a-600b of FIGS. 6A-6B, a first dielectric layer 602 lines the first side 104a of the first semiconductor substrate 104. In some embodiments, a second dielectric layer 604 lines the second side 104b of the first semiconductor substrate 104. The first dielectric layer 602 and the second dielectric layer 604 are a same dielectric material as the plurality of dielectric structures 402a-b. For clarity, the plurality of dielectric structures 402a-b are illustrated in phantom (as a dotted line) in FIG. 6A. In further embodiments, the plurality of dielectric structures 402a-b, the first dielectric layer 602, and the second dielectric layer 604 are portions of a larger dielectric structure (e.g., a continuous dielectric structure).

Also shown in the various views 600a-600b of FIGS. 6A-6B, in some embodiments, upper surfaces of the plurality of conductive pillars 102a-b are co-planar with a front side surface (e.g., the first side 104a) of the first semiconductor substrate 104. In further embodiments, bottom surfaces of the plurality of conductive pillars 102a-b are co-planar with a back side surface (e.g., the second side 104b) of the first semiconductor substrate 104. In other embodiments, the plurality of conductive pillars 102a-b protrude from the first side 104a of the first semiconductor substrate 104. In such embodiments, the upper surfaces of the plurality of conductive pillars 102a-b are disposed over the front side surface (e.g., the first side 104a) of the first semiconductor substrate 104. In further such embodiments, an upper surface of the first dielectric layer 602 and the upper surfaces of the plurality of conductive pillars 102a-b may be substantially co-planar. In other embodiments, the plurality of conductive pillars 102a-b protrude from the second side 104b of the first semiconductor substrate 104. In such embodiments, the bottom surfaces of the plurality of conductive pillars 102a-b are disposed below the back side surface (e.g., the second side 104b) of the first semiconductor substrate 104. In further such embodiments, a bottom surface of the second dielectric layer 604 and the bottom surfaces of the plurality of conductive pillars 102a-b may be substantially co-planar. In some embodiments, the plurality of conductive pillars 102a-b protrude from the first side 104a of the first semiconductor substrate 104 and protrude from the second side 104b of the first semiconductor substrate 104. In such embodiments, the upper surface of the first dielectric layer 602 and the upper surfaces of the plurality of conductive pillars 102a-b may be substantially co-planar, and the bottom surface of the second dielectric layer 604 and the bottom surfaces of the plurality of conductive pillars 102a-b may be substantially co-planar.

Figure 7:
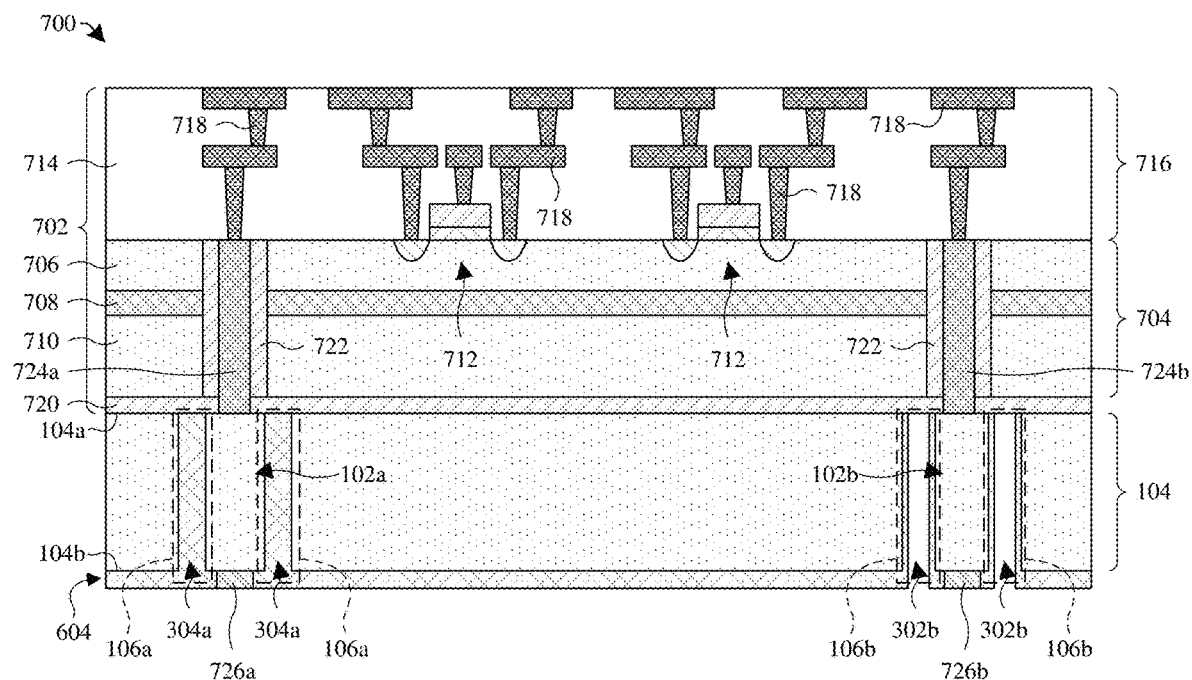
FIG. 7 illustrates a cross-sectional view of some embodiments of an integrated chip (IC) comprising some embodiments of the structure illustrated in FIGS. 6A-6B.

FIG. 7 illustrates a cross-sectional view 700 of some embodiments of an integrated chip (IC) (e.g., 3D IC) comprising some embodiments of the structure illustrated in FIGS. 6A-6B.

As shown in the cross-sectional view 700 of FIG. 7, a first integrated chip (IC) 702 (e.g., 2D IC) is disposed over the first semiconductor substrate 104. In some embodiments, the first IC 702 is bonded to the first semiconductor substrate 104. The first IC 702 comprises a second semiconductor substrate 704. The second semiconductor substrate 704 comprises any type of semiconductor body (e.g., silicon (Si), germanium (Ge), silicon-germanium (SiGe), monocrystalline silicon/CMOS bulk, a III-V semiconductor, semiconductor-on-insulator (SOI), etc.). In some embodiments, the second semiconductor substrate 704 is a semiconductor-on-insulator (SOI) substrate, as shown in the cross-sectional view 700 of FIG. 7. In such embodiments, the second semiconductor substrate 704 comprises a device layer 706, an insulating layer 708, and a handle layer 710. The device layer 706 is disposed over the insulating layer 708 and the handle layer 710. The insulating layer 708 is disposed vertically between the handle layer 710 and the device layer 706.

The device layer 706 is a semiconductor material. The semiconductor material may be or comprise, for example, silicon (Si), germanium (Ge), silicon-germanium (SiGe), gallium arsenide (GaAs), some other semiconductor material, or a combination of the foregoing. The handle layer 710 is disposed below both the insulating layer 708 and the device layer 706. The handle layer 710 may be or comprise, a semiconductor material (e.g., silicon (Si), germanium (Ge), monocrystalline silicon, polycrystalline silicon, etc.), a doped semiconductor material (e.g., doped silicon (Si), doped germanium (Ge), etc.), a metal (e.g., copper (Cu), aluminum (Al), tungsten (W), gold (Au), silver (Ag), platinum (Pt), etc.), or the like. The insulating layer 708 vertically separates the handle layer 710 from the device layer 706. The insulating layer 708 electrically isolates the device layer 706 from the handle layer 710. The insulating layer 708 may be or comprise, for example, an oxide (e.g., silicon dioxide ($SiO_2$)), a nitride (e.g., silicon nitride (SiN)), an oxy-nitride (e.g., silicon oxy-nitride (SiON)), a low-k dielectric (e.g., a dielectric material with a dielectric constant less than about 3.9), a high-k dielectric material (e.g., a dielectric material with a dielectric constant greater than about 3.9, such as hafnium oxide (HfO), tantalum oxide (TaO), hafnium silicon oxide (HfSiO), or the like), undoped silicate glass (USG), doped silicon dioxide (e.g., carbon doped silicon dioxide), borosilicate glass (BSG), phosphoric silicate glass (PSG), borophosphosilicate glass (BPSG), fluorinated silicate glass (FSG), a spin-on glass (SOG), some other dielectric material, or a combination of the foregoing.

A first plurality of semiconductor devices 712 (e.g., insulated gate field-effect transistors (IGFETs)) are disposed on/over the device layer 706. A first interconnect dielectric structure 714 is disposed over the second semiconductor substrate 704 and the first plurality of semiconductor devices 712. In some embodiments, the first interconnect dielectric structure 714 comprises one or more dielectric layers (e.g., one or more interlayer dielectric (ILD) layers). A first interconnect structure 716 is embedded in the first interconnect dielectric structure 714 and provides electrical connections between the first plurality of semiconductor devices 712. The first interconnect structure 716 comprises a first plurality of conductive interconnect features 718 (e.g., metal vias, metal wires, metal pads, metal contacts, etc.). In some embodiments, the first plurality of conductive interconnect features 718 are or comprise, for example, copper (Cu), aluminum copper (Al—Cu), tungsten (W), aluminum (Al), gold (Au), some other conductive material, or a combination of the foregoing. In further embodiments, the first interconnect dielectric structure 714 comprises one or more of, for example, a low-k dielectric layer (e.g., a dielectric with a dielectric constant less than about 3.9), an ultra-low-k dielectric layer, an oxide (e.g., $SiO_2$), some other dielectric material, or a combination of the foregoing.

A third dielectric layer 720 may be disposed below the second semiconductor substrate 704. In some embodiments, the third dielectric layer 720 is or comprises, for example, a low-k dielectric (e.g., a dielectric material with a dielectric constant less than about 3.9), a high-k dielectric material (e.g., a dielectric material with a dielectric constant greater than about 3.9, such as, hafnium oxide (HfO)), an oxide (e.g., $SiO_2$), a nitride (e.g., SiN), an oxy-nitride (e.g., SiON), some other dielectric material, or a combination of the foregoing.

A first plurality of isolation structures 722 are disposed in the second semiconductor substrate 704. In some embodiments, the first plurality of isolation structures 722 extend vertically through the second semiconductor substrate 704 between the first interconnect dielectric structure 714 and the third dielectric layer 720. In other embodiments, the first plurality of isolation structures 722 may extend vertically through the handle layer 710 between the insulating layer 708 and the third dielectric layer 720. In some embodiments, the first plurality of isolation structures 722 may be or comprise, for example, an oxide (e.g., SiO2), a nitride (e.g., SiN), an oxy-nitride (e.g., SiON), a carbide (e.g., SiC), some other dielectric material, or a combination of the foregoing A first plurality of conductive structures 724a-b are disposed in the second semiconductor substrate 704 and the third dielectric layer 720. For example, a first conductive structure 724a and a second conductive structure 724b are disposed in the second semiconductor substrate 704 and the third dielectric layer 720. The first plurality of conductive structures 724a-b may be or comprise, for example, copper (Cu), aluminum (Al), gold (Au), silver (Ag), platinum (Pt), or the like.

In some embodiments, the first plurality of conductive structures 724a-b extend vertically through the third dielectric layer 720 and the second semiconductor substrate 704 to the first plurality of conductive interconnect features 718. For example, the first conductive structure 724a extends vertically through the third dielectric layer 720 and the second semiconductor substrate 704 to a first conductive feature (e.g., a first conductive contact) of the first plurality of conductive interconnect features 718, and the second conductive structure 724b extends vertically through the third dielectric layer 720 and the second semiconductor substrate 704 to a second conductive feature (e.g., a second conductive contact) of the first plurality of conductive interconnect features 718. In such embodiments, the first plurality of conductive structures 724a-b are electrically coupled to the first plurality of conductive interconnect features 718. The first plurality of conductive structures 724a-b extend vertically through the second semiconductor substrate 704 by extending vertically through the first plurality of isolation structures 722, respectively.

In other embodiments, the first plurality of conductive structures 724a-b may extend vertically through the third dielectric layer 720, the handle layer 710, and the insulating layer 708 to the device layer 706. In such embodiments, the first plurality of conductive structures 724a-b are electrically coupled to the device layer 706. The first plurality of conductive structures 724a-b extend vertically through the handle layer 710 by extending vertically through the first plurality of isolation structures 722, respectively.

The first plurality of conductive structures 724a-b are electrically coupled to the plurality of conductive pillars 102a-b, respectively. For example, the first conductive structure 724a is electrically coupled to the first conductive pillar 102a and the second conductive structure 724b is electrically coupled to the second conductive pillar 102b. In some embodiments, ohmic contacts exist between the first plurality of conductive structures 724a-b and the plurality of conductive pillars 102a-b (e.g., due to the doping concentration of the plurality of conductive pillars 102a-b).

A second plurality of conductive structures 726a-b are disposed below the first semiconductor substrate 104. For example, a third conductive structure 726a and a fourth conductive structure 726b are disposed below the first semiconductor substrate 104. In some embodiments, the second plurality of conductive structures 726a-b are disposed, at least partially, in the second dielectric layer 604. The second plurality of conductive structures 726a-b are electrically coupled to the plurality of conductive pillars 102a-b, respectively. The second plurality of conductive structures 726a-b may be or comprise, for example, tungsten (W), copper (Cu), aluminum (Al), gold (Au), silver (Ag), platinum (Pt), or the like. In some embodiments, the first semiconductor substrate 104 is an interposer (e.g., silicon interposer).

The plurality of conductive pillars 102a-b electrically couple the first plurality of conductive structures 724a-b to the second plurality of conductive structures 726a-b. For example, the first conductive pillar 102a electrically couples the first conductive structure 724a to the third conductive structure 726a, and the second conductive pillar 102b electrically couples the second conductive structure 724b to the fourth conductive structure 726b. In some embodiments, ohmic contacts exist between the second plurality of conductive structures 726a-b and the plurality of conductive pillars 102a-b (e.g., due to the doping concentration of the plurality of conductive pillars 102a-b). In further embodiments, the second plurality of conductive structures 726a-b are input/output (I/O) structure (e.g., solder bumps, bond pads, etc.). In other embodiments, the second plurality of conductive structures 726a-b may be conductive vias that provide electrical connections between the plurality of conductive pillars 102a-b and other I/O structures (not shown) that are disposed below the second plurality of conductive structures 726a-b. In other embodiments, the second plurality of conductive structures 726a-b are omitted.

Figure 8:
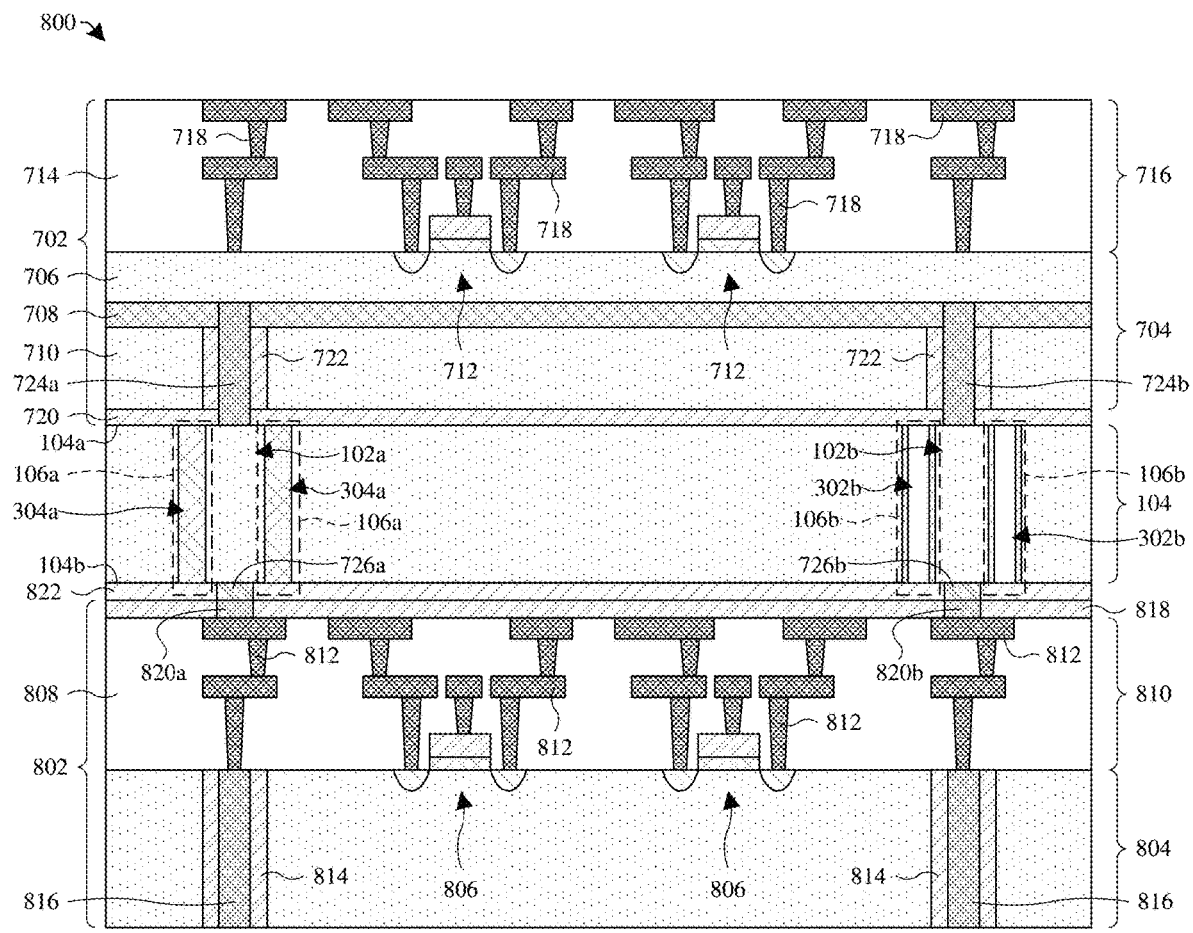
FIG. 8 illustrates a cross-sectional view of some other embodiments of the IC of FIG. 7.

FIG. 8 illustrates a cross-sectional view 800 of some other embodiments of the IC of FIG. 7.

As shown in the cross-sectional view 800 of FIG. 8, the first semiconductor substrate 104 is disposed vertically between the first IC 702 and a second IC 802 (e.g., 2D IC). In some embodiments, the second IC 802 is bonded to the first semiconductor substrate 104. The second IC 802 comprises a third semiconductor substrate 804. The third semiconductor substrate 804 comprises any type of semiconductor body (e.g., silicon (Si), germanium (Ge), silicon-germanium (SiGe), monocrystalline silicon/CMOS bulk, a III-V semiconductor, semiconductor-on-insulator (SOI), etc.).

A second plurality of semiconductor devices 806 (e.g., IGFETs) are disposed on/over the third semiconductor substrate 804. A second interconnect dielectric structure 808 is disposed over the third semiconductor substrate 804 and the second plurality of semiconductor devices 806. In some embodiments, the second interconnect dielectric structure 808 comprises one or more dielectric layers (e.g., one or more ILD layers). A second interconnect structure 810 is embedded in the second interconnect dielectric structure 808 and provides electrical connections between the second plurality of semiconductor devices 806. The second interconnect structure 810 comprises a second plurality of conductive interconnect features 812 (e.g., metal vias, metal wires, metal pads, metal contacts, etc.). In some embodiments, the second plurality of conductive interconnect features 812 are or comprise, for example, copper (Cu), aluminum copper (Al—Cu), tungsten (W), aluminum (Al), gold (Au), some other conductive material, or a combination of the foregoing. In further embodiments, the second interconnect dielectric structure 808 comprises one or more of, for example, a low-k dielectric layer (e.g., a dielectric with a dielectric constant less than about 3.9), an ultra-low-k dielectric layer, an oxide (e.g., $SiO_2$), some other dielectric material, or a combination of the foregoing.

In some embodiments, a second plurality of isolation structures 814 are disposed in the third semiconductor substrate 804. The second plurality of isolation structures 814 extend vertically through third semiconductor substrate 804. In some embodiments, the second plurality of isolation structures 814 may be or comprise, for example, an oxide (e.g., SiO2), a nitride (e.g., SiN), an oxy-nitride (e.g., SiON), a carbide (e.g., SiC), some other dielectric material, or a combination of the foregoing In some embodiments, a third plurality of conductive structures 816 (e.g., metal through-substrate vias (TSVs)) are disposed in the third semiconductor substrate 804. The third plurality of conductive structures 816 extend vertically through the third semiconductor substrate 804. The third plurality of conductive structures 816 extend vertically through the third semiconductor substrate 804 by extending vertically through the second plurality of isolation structures 814, respectively. The third plurality of conductive structures 816 are electrically coupled to the second interconnect structure 810. The third plurality of conductive structures 816 may be or comprise, for example, copper (Cu), aluminum (Al), gold (Au), silver (Ag), platinum (Pt), tungsten (W), or the like.

A fourth dielectric layer 818 is disposed over the second interconnect structure 810 and the second interconnect dielectric structure 808. In some embodiments, the fourth dielectric layer 818 is or comprises, for example, a low-k dielectric (e.g., a dielectric material with a dielectric constant less than about 3.9), a high-k dielectric material (e.g., a dielectric material with a dielectric constant greater than about 3.9, such as, hafnium oxide (HfO)), an oxide (e.g., $SiO_2$), a nitride (e.g., SiN), an oxy-nitride (e.g., SiON), some other dielectric material, or a combination of the foregoing.

A fourth plurality of conductive structures 820a-b are disposed over the second interconnect structure 810 and the second interconnect dielectric structure 808. For example, a fifth conductive structure 820a and a sixth conductive structure 820b are disposed over both the second interconnect structure 810 and the second interconnect dielectric structure 808. In some embodiments, the fourth plurality of conductive structures 820a-b are disposed in the fourth dielectric layer 818. The fourth plurality of conductive structures 820a-b are electrically coupled to the second interconnect structure 810. The fourth plurality of conductive structures 820a-b are electrically coupled to the plurality of conductive pillars 102a-b, respectively. Thus, the plurality of conductive pillars 102a-b provide an electrical connection between the first IC 702 and the second IC 802. In some embodiments, the fourth plurality of conductive structures 820a-b are electrically coupled to the second plurality of conductive structures 726a-b, respectively, which provide an electrical connection between the fourth plurality of conductive structures 820a-b and the plurality of conductive pillars 102a-b. The fourth plurality of conductive structures 820a-b may be or comprise, for example, copper (Cu), aluminum (Al), gold (Au), silver (Ag), platinum (Pt), or the like.

Also shown in the cross-sectional view 800 of FIG. 8, in some embodiments, a fifth dielectric layer 822 is disposed along (e.g., lines) the second side 104b of the first semiconductor substrate 104. In such embodiments, the fifth dielectric layer 822 is disposed vertically between the second IC 802 and the first semiconductor substrate 104. In further embodiments, the second plurality of conductive structures 726a-b are disposed, at least partially, in the fifth dielectric layer 822. In some embodiments, the fifth dielectric layer 822 is or comprises, for example, a low-k dielectric (e.g., a dielectric material with a dielectric constant less than about 3.9), a high-k dielectric material (e.g., a dielectric material with a dielectric constant greater than about 3.9, such as, hafnium oxide (HfO)), an oxide (e.g., $SiO_2$), a nitride (e.g., SiN), an oxy-nitride (e.g., SiON), some other dielectric material, or a combination of the foregoing.

While the cross-sectional view 800 of FIG. 8 illustrates the second interconnect structure 810 disposed vertically between the third semiconductor substrate 804 and the first semiconductor substrate 104, it will be appreciated that the second IC 802 may be flipped (e.g., rotated 180 degrees) so that the third semiconductor substrate 804 is disposed vertically between the second interconnect structure 810 and the first semiconductor substrate 104. In such embodiments, the third plurality of conductive structures 816 provide electrically connections between the plurality of conductive pillars 102a-b and the second interconnect structure 810. In further such embodiments, a plurality of I/O structures are disposed below the third semiconductor substrate 804 and the second interconnect structure 810, and the plurality of I/O structures are electrically coupled to the second interconnect structure 810.

FIG. 9 illustrates a cross-sectional view 900 of some other embodiments of the IC of FIG. 7.

As shown in the cross-sectional view 900 of FIG. 9, the IC comprises a plurality of dies. For example, the IC comprises a first die 902, a second die 904, and a third die 906. In some embodiments, the first die 902 may be a system on a chip die. In some embodiments, the second die 904 is one die of a first stack 908 of dies. In further embodiments, the third die 906 is one die of a second stack 910 of dies. The second die 904 may be a memory controller die, and the remaining dies of the first stack 908 of dies may be memory dies (e.g., DRAM dies). In further embodiments, the first stack 908 of dies is referred to as a high bandwidth memory (HBM) die stack. The third die 906 may also be a memory controller die, and the remaining dies of the second stack 910 of dies may be memory dies (e.g., DRAM dies). In further embodiments, the second stack 910 of dies is referred to as a HBM die stack. The dies of the first stack 908 of dies are electrically coupled together in a predefined manner via a first plurality of input/output (I/O) structures 909 (e.g., microbumps, TSVs, etc.). The dies of the second stack 910 of dies are electrically coupled together in a predefined manner via a second plurality of I/O structures 911 (e.g., microbumps, TSVs, etc.).

Also shown in the cross-sectional view 900 of FIG. 9, the IC comprises a package substrate 912 (e.g., a printed circuit board). A plurality of third I/O structures 914 are disposed on a first side of the package substrate 912. In some embodiments, the plurality of third I/O structures 914 may be, for example, solder balls (e.g., ball grid array) or the like. The package substrate 912 comprises a plurality of conductive features 916 embedded in an insulating material (e.g., organic substrate material). The plurality of conductive features 916 are electrically coupled to the plurality of third I/O structures 914 in a predefined manner.

The first semiconductor substrate 104 is disposed vertically between the package substrate 912 and the first die 902, vertically between the package substrate 912 and the first stack 908 of dies, and vertically between the package substrate 912 and the second stack 910 of dies. The plurality of conductive pillars 102a-b are disposed in the first semiconductor substrate 104. As shown in the cross-sectional view 900 of FIG. 9, the plurality of conductive pillars 102-b comprises more than two individual conductive pillars (e.g., the cross-sectional view 900 of FIG. 9 illustrates seven individual conductive pillars, but it will be appreciated any number of conductive pillars is amenable). An enlarged view of an area 918 is illustrated in FIG. 9 to further illustrate the features of (e.g., structural features of and adjacent to) each of the plurality of conductive pillars 102a-b.

The first die 902, the first stack 908 of dies, and the second stack 910 of dies are electrically coupled to the plurality of third I/O structures 914 by, at least partially, the plurality of conductive pillars 102a-b. For example, a fifth plurality of conductive structures 920 are disposed in the third dielectric layer 720. The plurality of conductive pillars 102a-b electrically couple the fifth plurality of conductive structures 920 to the second plurality of conductive structures 726a-b, respectively. For example, the first conductive pillar 102a electrically couples one of the fifth plurality of conductive structures 920 to the third conductive structure 726a. The fifth plurality of conductive structures 920 may be or comprise, for example, for example, tungsten (W), copper (Cu), aluminum (Al), gold (Au), silver (Ag), platinum (Pt), or the like.

The second plurality of conductive structures 726a-b are electrically coupled to a plurality of fourth I/O structures 922, respectively (e.g., microbumps, C4 bumps, etc.). In some embodiments, the second plurality of conductive structures 726a-b are electrically coupled to the plurality of fourth I/O structures 922 via a redistribution layer 924. The redistribution layer comprises a plurality of conductive features embedded in a dielectric layer. The plurality of conductive features of the redistribution layer 924 electrically connect the second plurality of conductive structures 726a-b to the plurality of fourth I/O structures 922 in a predefined manner. The plurality of fourth I/O structures 922 are electrically coupled to the plurality of conductive features 916 in a predefined manner. In some embodiments, an under fill material 925 laterally surrounds the third dielectric layer 720, the first semiconductor substrate 104, the fifth dielectric layer 822, the redistribution layer 924, and/or the plurality of fourth I/O structures 922.

Figure 10A:
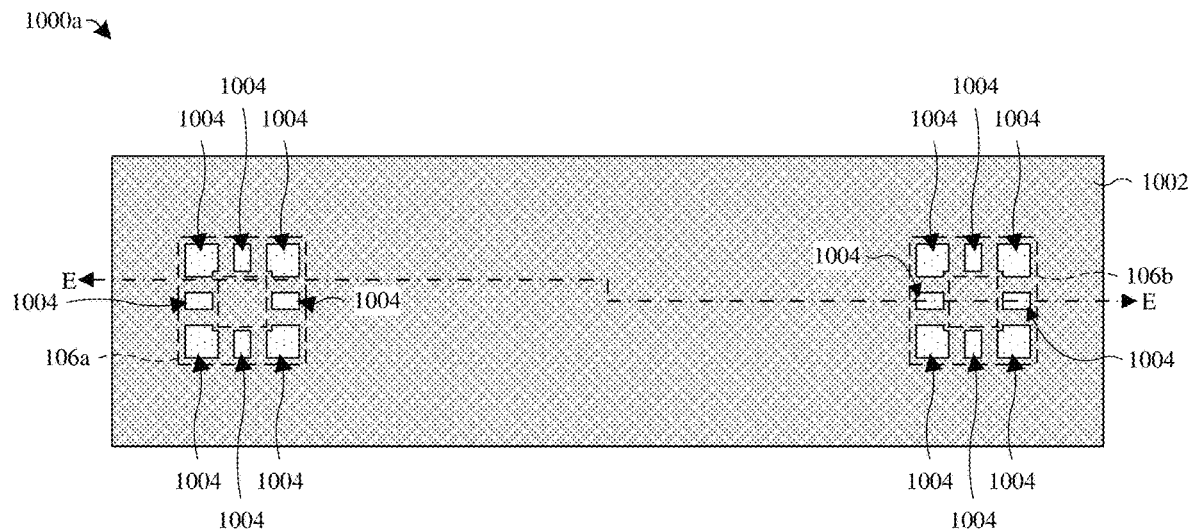
FIGS. 10A-10B through FIG. 14 illustrate a series of various views of some embodiments of a method for forming an integrated chip (IC) comprising a conductive pillar disposed in a first semiconductor substrate and anchored to the first semiconductor substrate by a plurality of dielectric anchors.
Figure 10B:
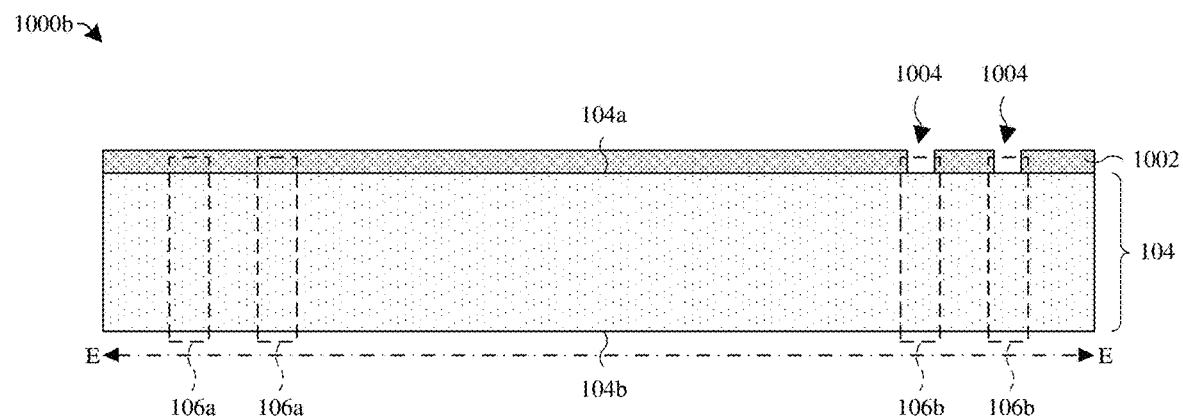

In some embodiments, a first interposer 926 (e.g., Si interposer) electrically couples the first stack 908 of dies to a plurality of fifth I/O structures 928 (e.g., microbumps, C4 bumps, etc.). In some embodiments, a second interposer 930 (e.g., Si interposer) electrically couples the second stack 910 of dies to a plurality of sixth I/O structures 932 (e.g., microbumps, C4 bumps, etc.). The plurality of fifth I/O structures 928 are electrically coupled to a first set of conductive structures of the fifth plurality of conductive structures 920. The plurality of sixth I/O structures 932 are electrically coupled to a second set of conductive structures of the fifth plurality of conductive structures 920. A plurality of seventh I/O structures 934 (e.g., microbumps, C4 bumps, etc.) electrically couples the first die 902 to a third set of conductive structures of the fifth plurality of conductive structures 920. As such, the plurality of conductive pillars 102a-b electrically couple, at least partially, the first die 902, the first stack 908 of dies, and the second stack 910 of dies to the plurality of third I/O structures 914. In some embodiments in which the plurality of conductive pillars 102a-b electrically couple the first die 902, the first stack 908 of dies, and the second stack 910 of dies to the plurality of third I/O structures 914, the first semiconductor substrate 104 may be referred to as an interposer (e.g., a third Si interposer). FIGS. 10A-10B through FIG. 14 illustrate a series of various views of some embodiments of a method for forming an integrated chip (IC) comprising a conductive pillar disposed in a first semiconductor substrate and anchored to the first semiconductor substrate by a plurality of dielectric anchors. Figures with a suffix of "A" (e.g., FIG. 10A-12A) illustrate a series of top views 1000a-1200a of some embodiments for forming the IC comprising the conductive pillar disposed in the first semiconductor substrate and anchored to the first semiconductor substrate by the plurality of dielectric anchors. Figures with a suffix of "B" (e.g., FIG. 10B-12B) illustrate a series of cross-sectional views of corresponding figures of FIGS. 10A-12A (e.g., FIG. 10B illustrates a cross-sectional view 1000b of the structure illustrated in FIG. 10A). The cross-sectional views 1000b-1200b are taken along line E-E of their corresponding top views (e.g., the cross-sectional view 1000b of FIG. 10B is taken along line E-E of the top view 1000a of FIG. 10A). Figures without a suffix (e.g., FIGS. 13-14) illustrate a series of cross-sectional views 1300-1400 that continue the series of various views from the cross-sectional view 1200b of FIG. 12B. The cross-sectional views 1300-1400 are taken along the same line E-E as the cross-sectional view 1200b of FIG. 12B. Although FIGS. 10A-10B through 14 are described with reference to a method, it will be appreciated that the structures shown in FIGS. 10A-10B through 14 are not limited to the method but rather may stand alone separate of the method.

As shown in top view 1000a of FIG. 10A and cross-sectional view 1000b of FIG. 10B, a patterned masking layer 1002 (e.g., positive/negative photoresist, a hardmask, etc.) is formed over a first side 104a of a first semiconductor substrate 104. The patterned masking layer comprises a plurality of apertures 1004 (e.g., a plurality of openings). A plurality of isolation regions 106a-b are disposed in the first semiconductor substrate 104. The plurality of apertures 1004 overlie the plurality of isolation regions 106a-b. For example, a first group of apertures of the plurality of apertures 1004 overlie the first isolation region 106a and a second group of apertures of the plurality of apertures 1004 overlies the second isolation region 106b.

In some embodiments, a process for forming the patterned masking layer 1002 comprises depositing a masking layer (not shown) on the first side 104a of the first semiconductor substrate 104. The masking layer may be deposited by, for example, chemical vapor deposition (CVD), physical vapor deposition (PVD), atomic layer deposition (ALD), a spin-on process, some other deposition process, or a combination of the foregoing. Thereafter, the masking layer is exposed to a pattern (e.g., via a lithography process, such as photolithography, extreme ultraviolet lithography, or the like) and developed, thereby forming the patterned masking layer 1002 over the first side 104a of the first semiconductor substrate 104.

Figure 11A:
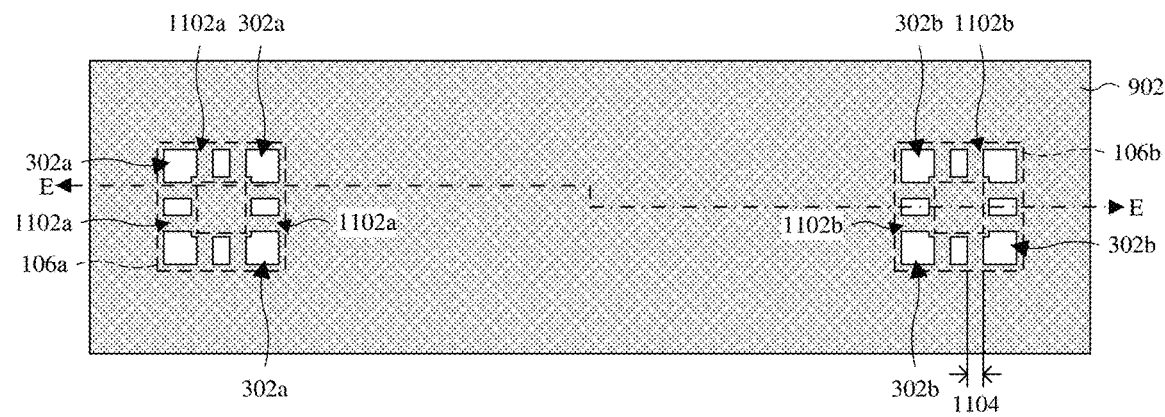
Figure 11B:
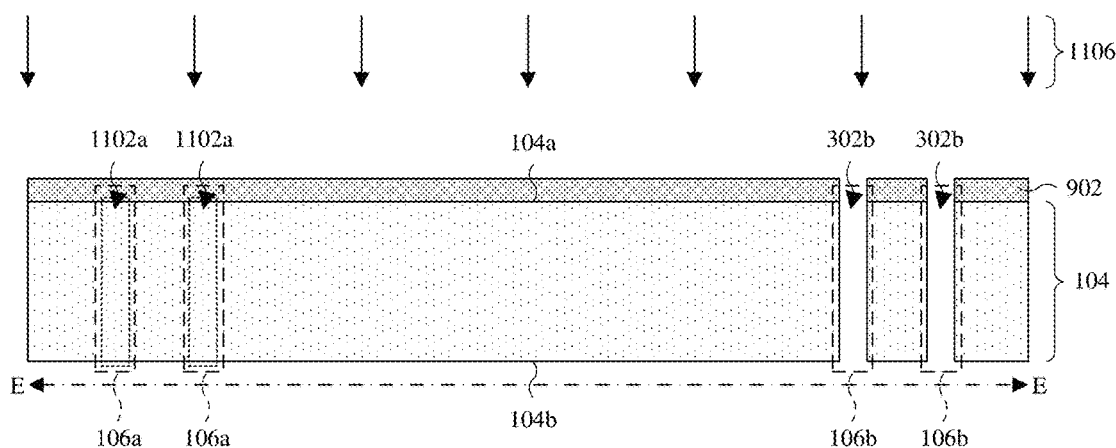

As shown in top view 1100a of FIG. 11A and cross-sectional view 1100b of FIG. 11B, a plurality of openings are formed in each of the plurality of isolation regions 106a-b. For example, a first plurality of openings 302a are formed in the first isolation region 106a and a second plurality of openings 302b are formed in the second isolation region 106b. In some embodiments, the plurality of openings extend vertically through the first semiconductor substrate 104. For example, the plurality of openings extend vertically through the first semiconductor substrate 104 from the first side 104a of the first semiconductor substrate to the second side 104b of the first semiconductor substrate 104. In other embodiments, the plurality of openings may extend partially vertically through the first semiconductor substrate 104 (e.g., not completely through the first semiconductor substrate 104).

Also shown in the top view 1100a of FIG. 11A and the cross-sectional view 1100b of FIG. 11B, a plurality of semiconductor anchors are formed in each of the plurality of isolation regions 106a-b. For example, a first plurality of semiconductor anchors 1102a are formed in the first isolation region 106a and a second plurality of semiconductor anchors 1102b are formed in the second isolation region 106b. Each of the semiconductor anchors of the plurality of semiconductor anchors (e.g., the first plurality of semiconductor anchors 1102a and the second plurality of semiconductor anchors 1102b) are disposed laterally between two neighboring openings of the plurality of openings. For example, a first semiconductor anchor of the first plurality of semiconductor anchors 1102a is disposed laterally between a first opening of the first plurality of openings 302a and a second opening of the first plurality of openings 302a (which neighbors the first opening of the first plurality of openings 302a), a second semiconductor anchor of the first plurality of semiconductor anchors 1102a is disposed later-ally between the second opening of the first plurality of openings 302a and a third opening of the first plurality of openings 302a (which neighbors the second opening of the first plurality of openings 302a), and so forth.

In some embodiments, the plurality of semiconductor anchors extend vertically through the first semiconductor substrate 104. For example, the plurality of semiconductor anchors extend vertically through the first semiconductor substrate 104 from the first side 104a of the first semiconductor substrate to the second side 104b of the first semiconductor substrate 104. In other embodiments, the plurality of semiconductor anchors may extend partially vertically through the first semiconductor substrate 104 (e.g., not completely through the first semiconductor substrate 104).

The semiconductor anchors of the plurality of semiconductor anchors are disposed along corresponding sides of the plurality of openings. The plurality of semiconductor anchors and the plurality of openings are formed laterally around corresponding portions of the first semiconductor substrate 104. For example, the first plurality of semiconductor anchors 1102a and the first plurality of openings 302a are formed laterally around a first portion of the first semiconductor substrate 104, and the second plurality of semiconductor anchors 1102b and the second plurality of openings 302b are formed laterally around a second portion of the first semiconductor substrate 104 (different than the first portion of the first semiconductor substrate 104).

The plurality of semiconductor anchors extend laterally between their corresponding portion of the first semiconductor substrate 104 and surrounding portions of the first semiconductor substrate 104. For example, a third portion of the first semiconductor substrate 104 laterally surrounds the first portion of the first semiconductor substrate 104 and the first plurality of semiconductor anchors 1102a, and a fourth portion of the first semiconductor substrate 104 laterally surrounds the second portion of the first semiconductor substrate 104 and the second plurality of semiconductor anchors 1102b. The first plurality of semiconductor anchors 1102a extend laterally between the first portion of the first semiconductor substrate 104 and the third portion of the first semiconductor substrate 104, and the second plurality of semiconductor anchors 1102b extend laterally between the second portion of the first semiconductor substrate 104 and the fourth portion of the first semiconductor substrate 104. Because the plurality of semiconductor anchors extend laterally between their corresponding portion of the first semiconductor substrate 104 and the surrounding portions of the first semiconductor substrate 104, the plurality of semiconductor anchors anchor their corresponding portion of the first semiconductor substrate 104 to the surrounding portions of the first semiconductor substrate 104. For example, the first plurality of semiconductor anchors 1102a anchor the first portion of the first semiconductor substrate 104 to the third portion of the first semiconductor substrate 104, and the second plurality of semiconductor anchors 1102b anchor the second portion of the first semiconductor substrate 104 to the fourth portion of the first semiconductor substrate 104.

The plurality of semiconductor anchors have a thickness 1104. In some embodiments, the thickness 1104 is between about 2 micrometers (μm) and about 4 μm. If the thickness 1104 is greater than about 4 μm, the plurality of semiconductor anchors may not fully convert to dielectric anchors (as described hereinafter), which may result in electrical shorts. If the thickness 1104 is less than about 2 μm, the plurality of semiconductor anchors may not provide sufficient structural support to their corresponding portions of the first semiconductor substrate 104 (e.g., to prevent cracking/ dislodging of the plurality of conductive pillars 102a-b). In further embodiments, each of the plurality of semiconductor anchors have the thickness 1104. In other embodiments, some of the plurality of semiconductor anchors may have a first thickness (e.g., the thickness 1104) and some other of the plurality of semiconductor anchors may have a second thickness that is different than the first thickness.

In some embodiments, a process for forming the plurality of openings (e.g., the first plurality of openings 302a and the second plurality of openings 302b) and the plurality of semiconductor anchors (e.g., the first plurality of semiconductor anchors 1102a and the second plurality of semiconductor anchors 1102b) comprises performing an etching process 1106 on the first semiconductor substrate 104 with the patterned masking layer 1002 in place over the first semiconductor substrate 104. The etching process 1106 selectively etches the first semiconductor substrate 104 according to the patterned masking layer 1002. Thus, the etching process 1106 removes portions of the first semiconductor substrate 104 that the plurality of apertures 1004 overlie (e.g., unmasked portions of the first semiconductor substrate 104), thereby forming the plurality of openings and the plurality of semiconductor anchors. The etching process may be or comprise, for example, a wet etching process, a dry etching process, a reactive ion etching (RIE) process, some other etching process, or a combination of the foregoing. Subsequently, in some embodiments, the patterned masking layer 1002 is stripped away.

Figure 12A:
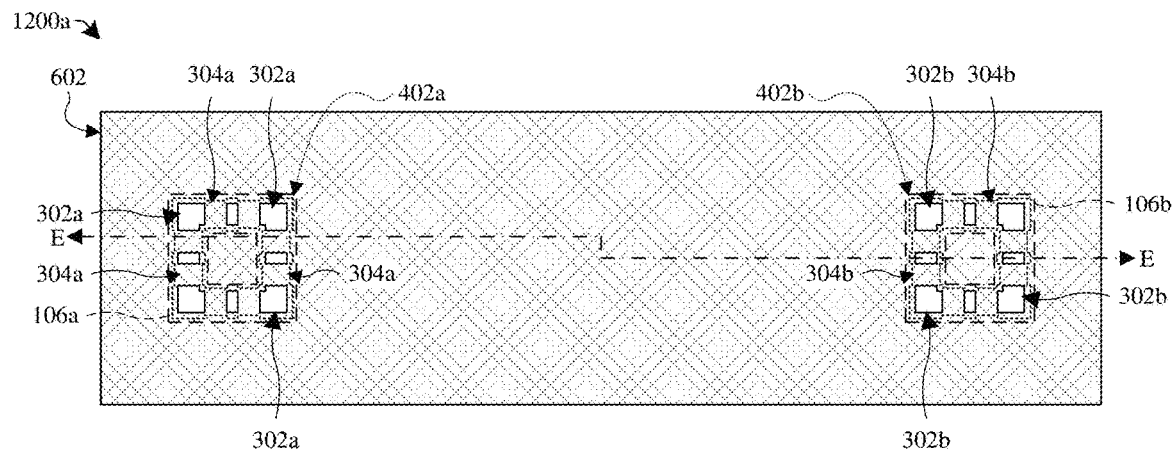
Figure 12B:
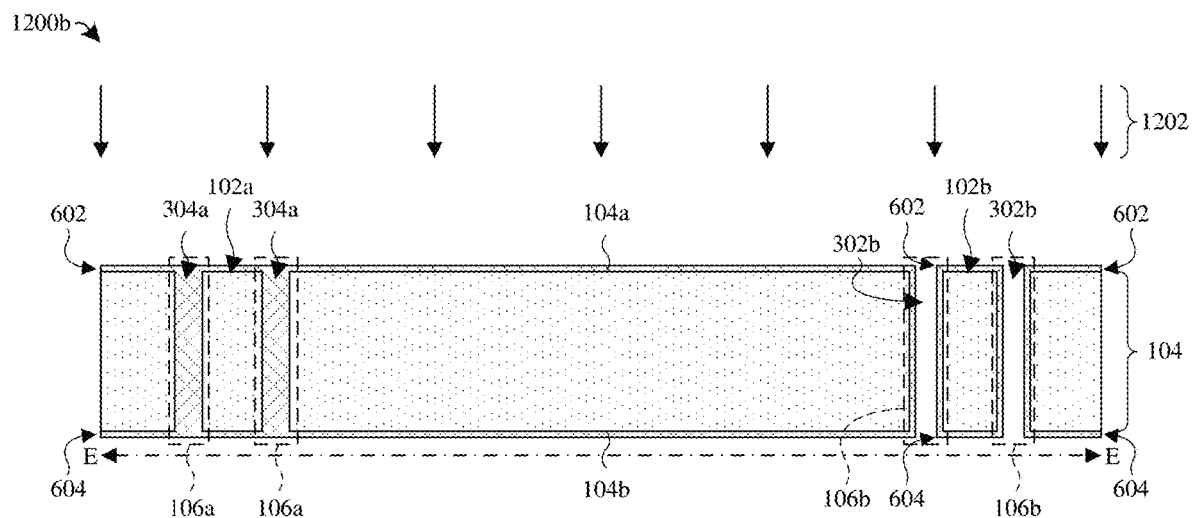

As shown in top view 1200a of FIG. 12A and cross-sectional view 1200b of FIG. 12B, an oxidation process 1202 is performed on the first semiconductor substrate 104 and the plurality of semiconductor anchors. The oxidation process 1202 forms a plurality of dielectric anchors in each of the plurality of isolation regions 106a-b. For example, the oxidation process 1202 forms a first plurality of dielectric anchors 304a in the first isolation region 106a and a second plurality of dielectric anchors 304b in the second isolation region 106b. The oxidation process 1202 forms the plurality of dielectric anchors (e.g., the first plurality of dielectric anchors 304a and the second plurality of dielectric anchors 304b) by converting the plurality of semiconductor anchors into the plurality of dielectric anchors (e.g., $SiO_2$ anchors). For example, the oxidation process 1202 causes a reaction that converts the first plurality of semiconductor anchors 1102a into the first plurality of dielectric anchors 304a and the second plurality of semiconductor anchors 1102b into the second plurality of dielectric anchors 304b.

By forming the plurality of dielectric anchors, a plurality of conductive pillars 102a-b are formed in the first semiconductor substrate 104. The plurality of conductive pillars 102a-b are electrically isolated from the first semiconductor substrate 104 by the plurality of dielectric anchors and the plurality of openings. For example, a first conductive pillar 102a and a second conductive pillar 102b are formed in the first semiconductor substrate 104. The first conductive pillar 102a is electrically isolated from the first semiconductor substrate 104 by the first plurality of dielectric anchors 304a and the first plurality of openings 302a. The second conductive pillar 102b is electrically isolated from the first semiconductor substrate 104 by the second plurality of dielectric anchors 304b and the second plurality of openings 302b.

Further, by forming the plurality of dielectric anchors, the plurality of conductive pillars 102a-b are anchored to the first semiconductor substrate 104 via the plurality of dielectric anchors. For example, the first conductive pillar 102a is anchored to the first semiconductor substrate 104 by the first plurality of dielectric anchors 304a, and the second conductive pillar 102b is anchored to the first semiconductor substrate 104 by the second plurality of dielectric anchors 304b. The plurality of conductive pillars 102a-b correspond to remaining portions (e.g., remaining after the oxidation process 1202) of the portions of the first semiconductor substrate 104 that the plurality of semiconductor anchors and the plurality of openings are disposed laterally around. For example, the first conductive pillar 102a corresponds to a remaining portion (remaining after the oxidation process 1202) of the first portion of the first semiconductor substrate 104, and the second conductive pillar 102b corresponds to a remaining portion (remaining after the oxidation process 1202) of the second portion of the first semiconductor substrate 104.

In some embodiments, the oxidation process 1202 also forms a plurality of dielectric structures 402a-b, a first dielectric layer 602, and/or a second dielectric layer 604. The plurality of dielectric structures 402a-b are formed in the first semiconductor substrate 104, the first dielectric layer 602 is formed along the first side 104a of the first semiconductor substrate 104, and the second dielectric layer 604 is formed along the second side 104b of the first semiconductor substrate 104. The oxidation process 1202 forms the plurality of dielectric structures 402a-b, the first dielectric layer 602, and the second dielectric layer 604 in a substantially similar manner as the plurality of dielectric anchors (e.g., by converting exposed portions of the first semiconductor substrate 104 into corresponding $SiO_2$ structures). In some embodiments, the oxidation process 1202 is a thermal oxidation process (e.g., dry oxidation, wet oxidation, etc.). In further embodiments, the thermal oxidation process comprises heating the first semiconductor substrate 104 to an oxidizing temperature for a period of time. In further embodiments, the oxidizing temperature is between 1000° C. and 1100° C., and the period of time is between 9 hours and 16 hours. In some embodiments, if the oxidizing temperature is less than 1000° C. and/or the period of time is less than 9 hours, the oxidation process 1202 may not sufficiently form the plurality of dielectric anchors (e.g., the oxidation process 1202 may not sufficiently convert the plurality of semiconductor anchors into the plurality of dielectric anchors), which may result in decreased performance (e.g., increased leakage current through the first semiconductor substrate 104). In other embodiments, if the oxidizing temperature is greater than 1100° C. and/or the period of time is greater than 16 hours, the oxidation process 1202 may reduce a size (e.g., cross-sectional area) of the plurality of conductive pillars (e.g., the oxidation process 1202 may unsatisfactorily convert portions of the first semiconductor substrate 104, which were intended to be portions of the plurality of conductive pillars, into an oxide), which may result in decreased performance (e.g., increased resistance of the plurality of conductive pillars).

Figure 13:
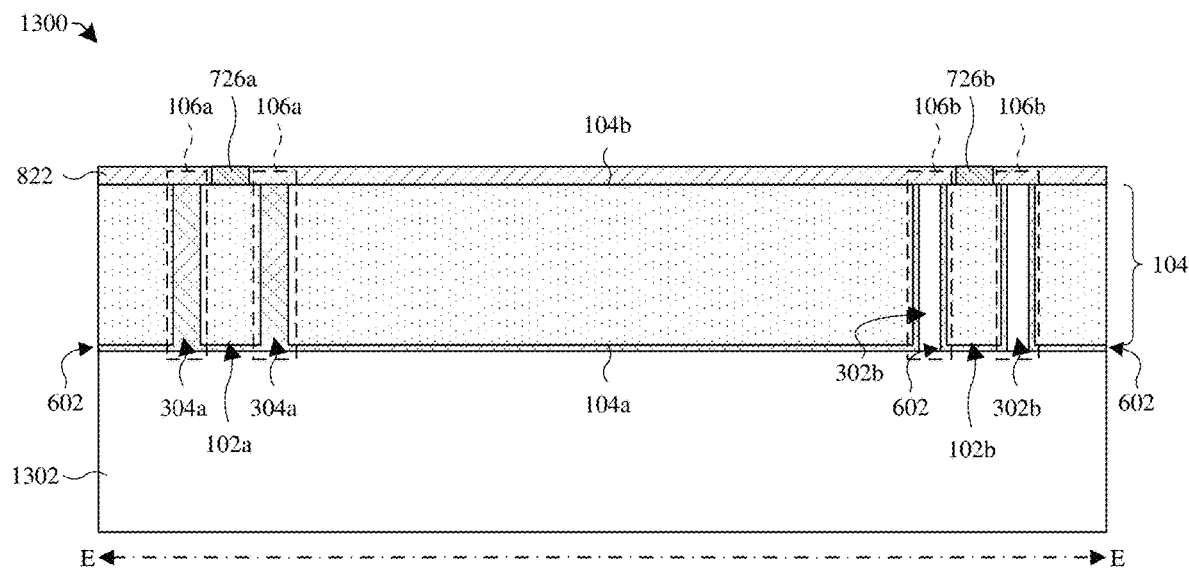
Figure 14:
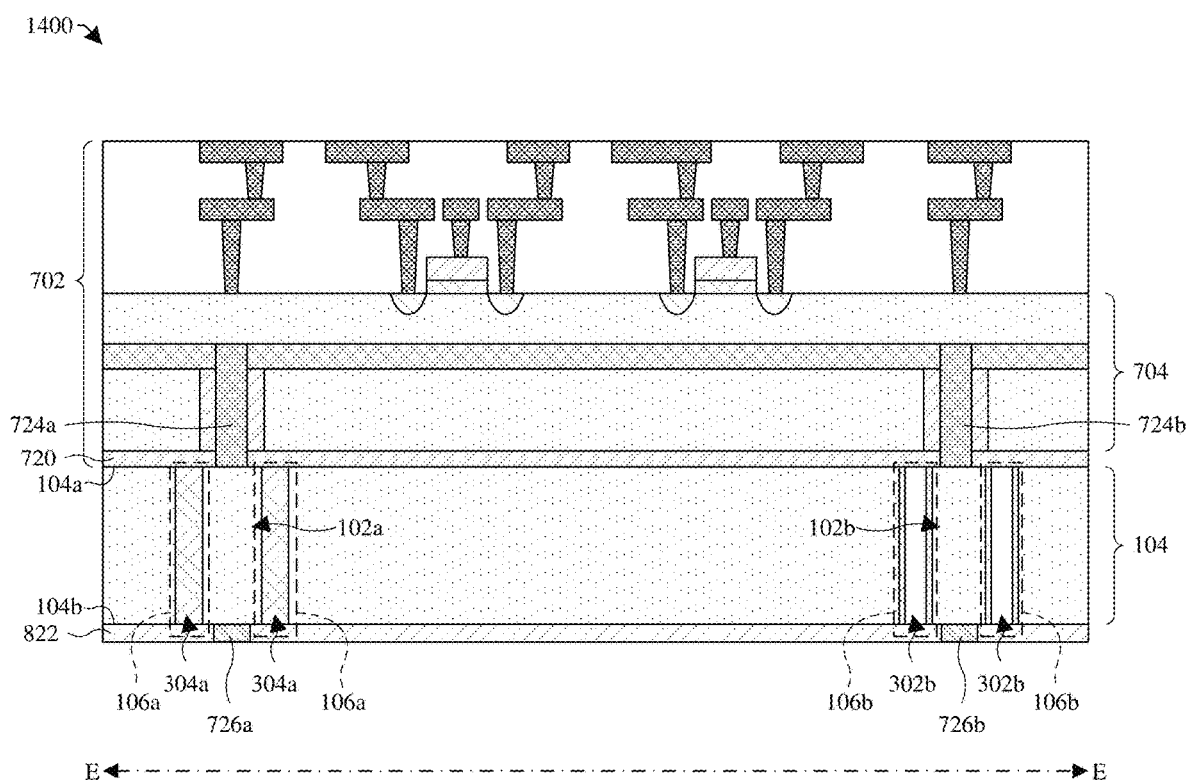

As shown in the cross-sectional view 1300 of FIG. 13, a fifth dielectric layer 822 is formed on the second side 104b of the first semiconductor substrate 104. Further, a second plurality of conductive structures 726a-b are formed on the second side 104b of the first semiconductor substrate 104. The second plurality of conductive structures 726a-b are formed so that the second plurality of conductive structures 726a-b are electrically coupled to the plurality of conductive pillars 102a-b. For example, the second plurality of conductive structures 726a-b are formed so that a third conductive structure 726a is electrically coupled to the first conductive pillar 102a and a fourth conductive structure 726b is electrically coupled to the second conductive pillar 102b.

In some embodiments, a process for forming the fifth dielectric layer 822 and the second plurality of conductive structures 726a-b comprises (temporarily) bonding a first carrier substrate 1302 (e.g., silicon carrier substrate) to the first semiconductor substrate 104. The first side 104a of the first semiconductor substrate 104 faces the first carrier substrate 1302. In some embodiments, the first carrier substrate 1302 is (temporarily) bonded to the first dielectric layer 602.

Thereafter, the fifth dielectric layer 822 is formed over the second side 104b of the first semiconductor substrate 104. In some embodiments, a cleaning process (e.g., etching process, grinding process, and/or planarization process) is performed on the first semiconductor substrate 104 to remove the second dielectric layer 604 (see, e.g., FIGS. 12A-12B) before the fifth dielectric layer 822 is formed. In such embodiments, the fifth dielectric layer 822 may be deposited or grown on/over the second side 104b of the first semiconductor substrate 104. In other embodiments, the fifth dielectric layer 822 may be formed on/over the second dielectric layer 604. In such embodiments, the fifth dielectric layer 822 may be deposited on/over the second dielectric layer 604. The fifth dielectric layer 822 may be deposited or grown by, for example, CVD, PVD, ALD, thermal oxidation, some other deposition process, or a combination of the foregoing.

A plurality of openings (not shown) are then formed in the fifth dielectric layer 822 (and the second dielectric layer 604). The openings expose, at least partially, the plurality of conductive pillars 102a-b. In some embodiments, a process for forming the plurality of openings comprises forming a patterned masking layer (not shown) (e.g., positive/negative photoresist, a hardmask, etc.) over the fifth dielectric layer 822. The patterned masking layer may be formed by forming a masking layer (not shown) on the fifth dielectric layer 822 (e.g., via a spin-on process), exposing the masking layer to a pattern (e.g., via a lithography process, such as photolithography, extreme ultraviolet lithography, or the like), and developing the masking layer to form the patterned masking layer. Thereafter, with the patterned masking layer in place, an etching process is performed on the fifth dielectric layer 822 to selectively etch the fifth dielectric layer 822 according to the patterned masking layer. The etching process removes unmasked portions of the fifth dielectric layer 822, thereby forming the plurality of openings. In some embodiments, the etching process may be or comprise, for example, a wet etching process, a dry etching process, a RIE process, some other etching process, or a combination of the foregoing. Subsequently, the patterned masking layer is stripped away. In some embodiments, the plurality of openings that are then formed in the fifth dielectric layer 822 may be referred to as the plurality of trenches.

A conductive material (e.g., tungsten (W), copper (Cu), aluminum (Al), gold (Au), silver (Ag), platinum (Pt), or the like) is then deposited on the fifth dielectric layer 822 and in the plurality of openings. Thereafter, a planarization process (e.g., a chemical mechanical polishing (CMP) process, an etch back process, etc.) is performed on the conductive material to form the second plurality of conductive structures 726a-b in the fifth dielectric layer 822. It will be appreciated that the second plurality of conductive structures 726a-b may be formed before the fifth dielectric layer 822 (e.g., via a metal etching process and subsequent deposition of a dielectric material).

As discussed above, in some embodiments, the plurality of openings (e.g., the first plurality of openings 302a and the second plurality of openings 302b) may be formed so that they extend partially vertically through the first semiconductor substrate 104 (e.g., not completely through the first semiconductor substrate 104). In such embodiments, a removal process (e.g., a grinding process) may be performed on the second side 104b of the first semiconductor substrate 104 (and the second dielectric layer 604) to reveal the plurality of openings. In other words, the removal process removes the portion of the first semiconductor substrate 104 that the plurality of openings do not extend vertically through, such that the plurality of openings extend fully through the first semiconductor substrate 104 after the removal process.

As shown in the cross-sectional view 1400 of FIG. 14, a first IC 702 is bonded to the first semiconductor substrate 104 and the plurality of conductive pillars 102a-b. The first IC 702 comprises a first plurality of conductive structures 724a-b disposed in a second semiconductor substrate 704. For example, the first IC 702 comprises a first conductive structure 724a and a second conductive structure 724b disposed in the second semiconductor substrate 704. The first IC 702 (and thus the first plurality of conductive structures 724a-b and the second semiconductor substrate 704) is bonded to the first semiconductor substrate 104 and the plurality of conductive pillars 102a-b, such that the first plurality of conductive structures 724a-b are electrically coupled to the plurality of conductive pillars 102a-b, respectively. For example, the first IC 702 is bonded to the first semiconductor substrate 104 so that the first conductive structure 724a is electrically coupled to the first conductive pillar 102a and the second conductive structure 724b is electrically coupled to the second conductive pillar 102b.

In some embodiments, a process for bonding the first IC 702 to the first semiconductor substrate 104 and the plurality of conductive pillars 102a-b comprises (temporarily) bonding a second carrier substrate (not shown) to the first semiconductor substrate 104. The second side 104b of the first semiconductor substrate 104 faces the second carrier substrate. In some embodiments, the second carrier substrate is (temporarily) bonded to the fifth dielectric layer 822 (see, e.g., FIG. 13). The second carrier substrate may be bonded to the first semiconductor substrate 104 while the first carrier substrate 1302 is also bonded to the first semiconductor substrate 104. After the second carrier substrate is bonded to the first semiconductor substrate 104, the first carrier substrate 1302 is removed from the first semiconductor substrate 104.

In some embodiments, a cleaning process (e.g., etching process, grinding process, and/or planarization process) is then performed on the first semiconductor substrate 104 and the plurality of conductive pillars 102a-b to remove the first dielectric layer 602. Thereafter, the first IC 702 is bonded to the first side 104a of the first semiconductor substrate 104 and to the plurality of conductive pillars 102a-b via a bonding process. The bonding process may be, for example, a eutectic bonding process, a hybrid bonding process, a direct bonding process, or some other bonding process. Subsequently, the second carrier substrate is removed from the first semiconductor substrate 104.

In some embodiments, bonding the first IC 702 to the first semiconductor substrate 104 comprises bonding the plurality of conductive pillars 102a-b to (e.g., directly to) the first plurality of conductive structures 724a-b. In some embodiments, bonding the first IC 702 to the first semiconductor substrate 104 comprises bonding a third dielectric layer 720 of the first IC 702 to (e.g., directly to) the first semiconductor substrate 104 and the plurality of dielectric anchors. In other embodiments, bonding the first IC 702 to the first semiconductor substrate 104 comprises bonding the second semiconductor substrate 704 to (e.g., directly to) the first semiconductor substrate 104 and the plurality of dielectric anchors. While not shown in the cross-sectional view 1400 of FIG. 14, it will be appreciated that another IC may be bonded to the first IC 702 and/or another IC may be bonded to the first semiconductor substrate 104. For example, a second IC (see, e.g., second IC 802 of FIG. 8) may be bonded to the first semiconductor substrate 104 in a substantially similar manner as the first IC 702 is bonded to the first semiconductor substrate 104. It will also be appreciated that one or more I/O structure may be formed on the second plurality of conductive structure 726a-b after (or before) the first IC 702 is bonded to the first semiconductor substrate 104.

Figure 15:
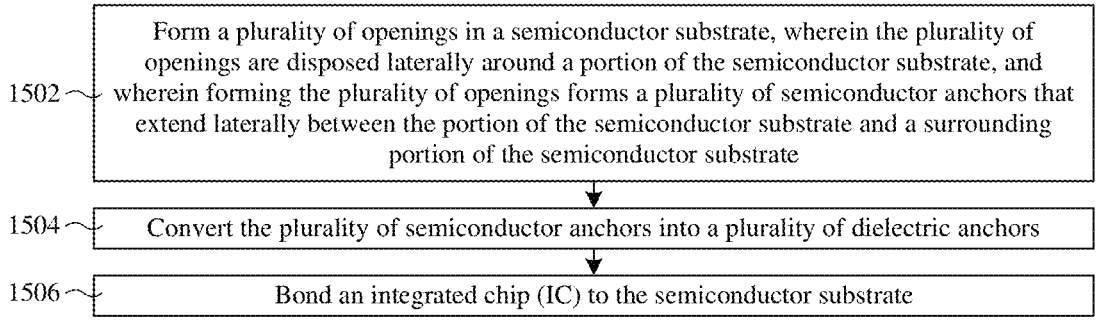
FIG. 15 illustrates a flowchart of some embodiments of a method for forming an integrated chip (IC) comprising a conductive pillar disposed in a first semiconductor substrate and anchored to the first semiconductor substrate by a plurality of dielectric anchors.

FIG. 15 illustrates a flowchart 1500 of some embodiments of a method for forming an integrated chip (IC) comprising a conductive pillar disposed in a first semiconductor substrate and anchored to the first semiconductor substrate by a plurality of dielectric anchors. While the flowchart 1500 of FIG. 15 is illustrated and described herein as a series of acts or events, it will be appreciated that the illustrated ordering of such acts or events is not to be interpreted in a limiting sense. For example, some acts may occur in different orders and/or concurrently with other acts or events apart from those illustrated and/or described herein. Further, not all illustrated acts may be required to implement one or more aspects or embodiments of the description herein, and one or more of the acts depicted herein may be carried out in one or more separate acts and/or phases.

At act 1502, a plurality of openings are formed in a semiconductor substrate, wherein the plurality of openings are disposed laterally around a portion of the semiconductor substrate, and wherein forming the plurality of openings forms a plurality of semiconductor anchors that extend laterally between the portion of the semiconductor substrate and a surrounding portion of the semiconductor substrate. FIGS. 10A-10B through 11A-11B illustrate a series of various views of some embodiments corresponding to act 1502.

At act 1504, the plurality of semiconductor anchors are converted to a plurality of dielectric anchors. FIGS. 12A-12B illustrates various views 1200a-1200b of some embodiments corresponding to act 1504.

At act 1506, an integrated chip (IC) is bonded to the semiconductor substrate. FIGS. 13-14 illustrate a series of cross-sectional views of some embodiments corresponding to act 1506.

In some embodiments, the present application provides an apparatus. The apparatus comprises a first semiconductor substrate. A conductive pillar is disposed in the first semiconductor substrate. An isolation region is disposed in the first semiconductor substrate and extends laterally around the conductive pillar in a closed loop path, wherein the isolation region is configured to electrically isolate the conductive pillar from a surrounding portion of the first semiconductor substrate. A trench is disposed in the isolation region. A dielectric anchor is disposed in the isolation region, wherein the dielectric anchor extends vertically through the first semiconductor substrate along a side of the trench, and wherein the dielectric anchor anchors the conductive pillar to the first semiconductor substrate.

In some embodiments, the present application provides an apparatus. The apparatus comprises a semiconductor substrate. A conductive pillar is disposed in the semiconductor substrate. An isolation region is disposed in the semiconductor substrate and extends laterally around the conductive pillar in a closed loop path, wherein the isolation region is configured to electrically isolate the conductive pillar from a surrounding portion of the semiconductor substrate. A plurality of openings are disposed in the isolation region, wherein the openings extend vertically through the semiconductor substrate along sides of the conductive pillar. A plurality of dielectric anchors are disposed in the isolation region, wherein the dielectric anchors anchor the conductive pillar to the semiconductor substrate, and wherein each of the dielectric anchors are disposed laterally between two neighboring openings of the plurality of openings.

In some embodiments, the present application provides a method. The method comprises receiving a first semiconductor substrate. A plurality of openings are formed that extend vertically through the first semiconductor substrate, wherein the openings are laterally disposed around a portion of the first semiconductor substrate, wherein forming the plurality of openings forms a plurality of semiconductor anchors laterally between the openings, and wherein the plurality of semiconductor anchors extend laterally between the portion of the first semiconductor substrate and a surrounding portion of the first semiconductor substrate. An oxidation process is performed on the plurality of semiconductor anchors to convert the plurality of semiconductor anchors into a plurality of dielectric anchors.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, the method comprising:
   receiving a first semiconductor substrate;
   forming a plurality of openings that extend vertically through the first semiconductor substrate, wherein the openings are laterally disposed around a portion of the first semiconductor substrate, wherein forming the plurality of openings forms a plurality of semiconductor anchors laterally between the openings, and wherein the plurality of semiconductor anchors extend laterally between the portion of the first semiconductor substrate and a surrounding portion of the first semiconductor substrate; and
   performing an oxidation process on the plurality of semiconductor anchors to convert the plurality of semiconductor anchors into a plurality of dielectric anchors.

2. The method of claim 1, further comprising:
   bonding a second semiconductor substrate to the first semiconductor substrate, wherein bonding the second semiconductor substrate to the first semiconductor substrate electrically couples a conductive feature disposed in the second semiconductor substrate to the portion of the first semiconductor substrate.

3. The method of claim 1, further comprising:
   bonding an integrated circuit (IC) to a first side of the first semiconductor substrate, wherein the IC comprises a second semiconductor substrate and a conductive structure extending through the second semiconductor substrate to the portion of the first semiconductor substrate.

4. The method of claim 1, wherein the plurality of openings and the plurality of dielectric anchors collectively have a ring-shaped top geometry surrounding the portion of the first semiconductor substrate.

5. The method of claim 1, wherein the plurality of openings and the plurality of dielectric anchors completely separate the portion of the first semiconductor substrate from the surrounding portion of the first semiconductor substrate.

6. The method according to claim 1, wherein the plurality of openings are spaced in a closed path around the portion of the first semiconductor substrate, and wherein each of the plurality of semiconductor anchors is between, and exposed within, a pair of neighboring openings of the plurality of openings.

7. The method according to claim 6, wherein the plurality of openings have a total of 8 openings and are evenly spaced in the closed path.

8. A method, comprising:
performing an etch into a semiconductor substrate to form one or more openings that demarcate one or more semiconductor anchor portions of the semiconductor substrate and a via portion of the semiconductor substrate, wherein the one or more openings and the one or more semiconductor anchor portions alternate laterally in a closed path around the via portion; and
oxidizing the one or more semiconductor anchor portions into one or more dielectric anchor structures, wherein the one or more openings and the one or more dielectric anchor structures completely separate the via portion from a remainder of the semiconductor substrate.

9. The method according to claim 8, wherein the oxidizing blankets a top surface of the semiconductor substrate with oxide, blankets a bottom surface of the semiconductor substrate with oxide, and blankets sidewalls of the semiconductor substrate in the one or more openings with oxide.

10. The method according to claim 8, wherein the one or more openings and the one or more semiconductor anchor portions have individual heights equal to a height of the semiconductor substrate.

11. The method according to claim 8, further comprising:
bonding a first side of the semiconductor substrate to a carrier substrate;
depositing a dielectric layer on a second side of the semiconductor substrate, opposite the first side of the semiconductor substrate; and
forming a conductive structure inset into the dielectric layer and directly contacting the via portion.

12. The method according to claim 11, wherein the oxidizing blankets a surface of the semiconductor substrate on the second side of the semiconductor substrate with oxide, and wherein the method further comprises:
removing the oxide blanketing the surface of the semiconductor substrate before the depositing of the dielectric layer.

13. The method according to claim 11, further comprising:
bonding an integrated circuit (IC) to the second side of the semiconductor substrate, wherein the IC comprises an interconnect structure electrically coupled to the first side of the semiconductor substrate through the via portion of the semiconductor substrate and the conductive structure.

14. The method according to claim 8, wherein the one or more openings comprise a plurality of openings, and wherein the one or more semiconductor anchor portions comprise a plurality of semiconductor anchor portion.

15. A method, comprising:
patterning a semiconductor substrate to form a plurality of openings, which extend from a first side of the semiconductor substrate to a second side of the semiconductor substrate opposite the first side and which are spaced from each other in a ring-shaped path to demarcate a pillar portion of the semiconductor substrate;
oxidizing portions of the semiconductor substrate that separate the plurality of openings from each other; and
bonding a first integrated circuit (IC) to the first side of the semiconductor substrate, wherein the bonding electrically couples the first IC to the second side of the semiconductor substrate through the pillar portion of the semiconductor substrate.

16. The method according to claim 15, wherein the oxidizing forms a plurality of dielectric structures in place of the portions of the semiconductor substrate, and wherein the plurality of dielectric structures and the plurality of openings electrically isolate the pillar portion of the semiconductor substrate from a remainder of the semiconductor substrate.

17. The method according to claim 16, wherein each of the plurality of dielectric structures is laterally between and laterally exposed in two neighboring openings of the plurality of openings.

18. The method according to claim 15, further comprising:
bonding a second IC to the second side of the semiconductor substrate, wherein second IC is electrically coupled to the first IC through the pillar portion of the semiconductor substrate after the bonding of the first IC and the bonding to the second IC.

19. The method according to claim 15, further comprising:
forming a conductive bump on the second side of the semiconductor substrate, wherein the conductive bump is directly electrically coupled to the first IC through the pillar portion of the semiconductor substrate.

20. The method according to claim 15, wherein the first IC comprises a semiconductor-on-insulator (SOI) substrate, which comprises a handle layer, a device layer, and an insulator layer between the handle layer and the device layer, wherein the first IC further comprises a conductive structure extending from the pillar portion of the semiconductor substrate, through the handle layer and the insulator layer, to the device layer at completion of the bonding, and wherein the conductive structure and the insulator layer have individual surfaces facing away from the semiconductor substrate and level with each other.

* * * * *